(12) United States Patent
Tran et al.

(10) Patent No.: US 6,590,825 B2
(45) Date of Patent: Jul. 8, 2003

(54) NON-VOLATILE FLASH FUSE ELEMENT

(75) Inventors: Hieu Van Tran, San Jose, CA (US); William John Saiki, Mountain View, CA (US); George J. Korsh, Redwood City, CA (US); Sakhawat M. Khan, Los Altos, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/002,036

(22) Filed: Nov. 1, 2001

(65) Prior Publication Data

US 2003/0086326 A1 May 8, 2003

(51) Int. Cl.[7] .................................................. G11C 7/00
(52) U.S. Cl. ............................. 365/225.7; 365/189.11; 365/189.05; 365/207
(58) Field of Search ...................... 365/225.7, 189.11, 365/189.05, 189.06, 230.08, 203, 189.12, 207; 327/525

(56) References Cited

U.S. PATENT DOCUMENTS

| | | | |
|---|---|---|---|
| 5,469,401 A | * 11/1995 | Gillingham | 365/200 |
| 5,642,316 A | 6/1997 | Tran et al. | |
| 5,933,370 A | 8/1999 | Holzmann et al. | |
| 5,995,413 A | 11/1999 | Holzmann et al. | |
| 6,002,620 A | 12/1999 | Tran et al. | |
| 6,346,738 B1 | * 2/2002 | Kim et al. | 257/529 |
| 6,420,925 B1 | * 7/2002 | Fifield et al. | 327/525 |
| 6,430,101 B1 | * 8/2002 | Toda | 365/225.7 |

* cited by examiner

Primary Examiner—David Lam
(74) Attorney, Agent, or Firm—Gray Cary Ware & Freidenrich LLP

(57) ABSTRACT

A non-volatile flash fuse element and an array of such elements include fuses coupled to the input of a latch arranged as a differential comparator for constant current differential sensing. The fuse element includes a margining circuit that provides differential mass fuse margining. The margining circuit also allows the fuses to be stressed and screened. The fuse elements also provide constant current parallel programming.

95 Claims, 6 Drawing Sheets

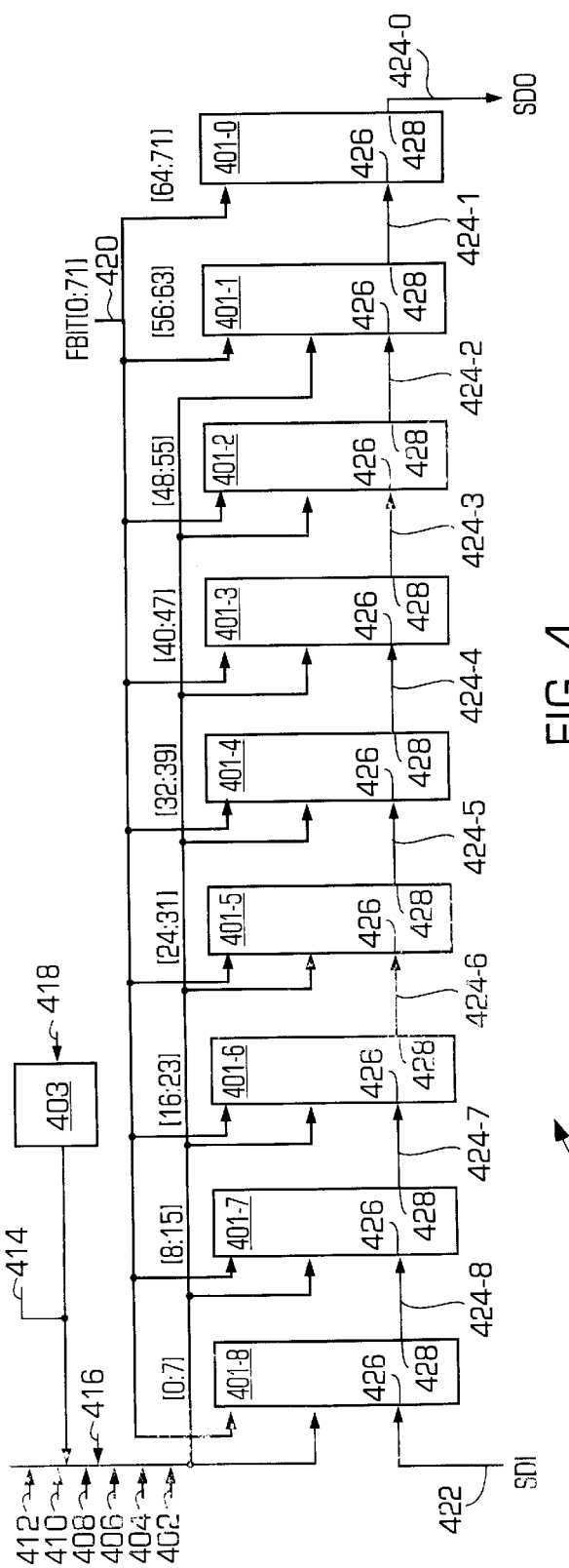
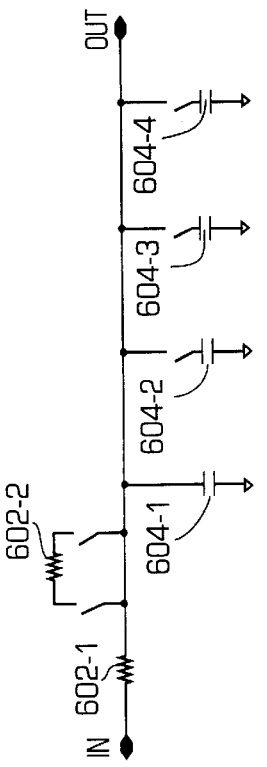
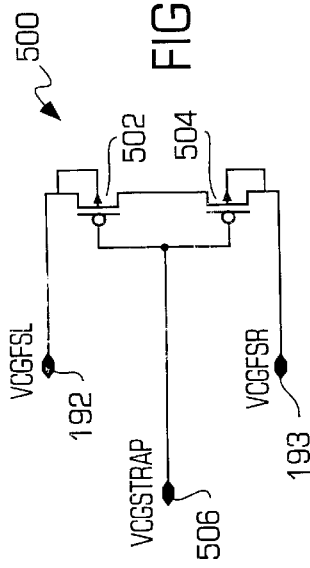
FIG. 4
FIG. 5
FIG. 6

NON-VOLATILE FLASH FUSE ELEMENT

BACKGROUND OF THE INVENTION

The present invention relates to flash fuse element memory cells, and more particularly to non-volatile flash fuse memory cells having provisions for margining, testing and stressing.

A flash memory is a type of non-volatile memory cell that is electrically reprogrammable. Flash memories are used in various electronic systems such as cellular telephones, personal data assistants (PDA), and notebook computers. The flash memories typically are used for configuration bit storage, redundancy information, non-volatile program, read, and erase algorithm parameter setting, maker and manufacturing identification, and voltage reference and bias trimming. The flash memories typically use programmable fuse elements. Conventional fuse elements are single ended sensing, uncontrolled current differential sensing or with reduced margin.

SUMMARY OF THE INVENTION

The present invention provides a memory device comprising first and second fuse elements and a latch coupled to the fuse elements for storing the contents of the first and second fuse elements. In another aspect, the latch includes a differential amplifier. In another aspect, the fuse elements include split gate memory cells.

In one aspect of the present invention, the memory-device comprises first and second margining circuits coupled in parallel to the first and second fuse elements, respectively. In another aspect, margining circuits comprise transistors that have electrical characteristics similar to the control gate and floating gate of a split gate memory cell of the fuse elements. In another aspect, the margining circuits use current offset to check margin.

In one aspect of the present invention, an equalization network is coupled between the first and second fuse elements to equalize a control voltage applied to the first and second fuse elements.

In one aspect of the present invention, a resistor-capacitor filter is coupled to the gate of the split gate memory cell of the fuse elements.

In one aspect of the present invention, a clamp is coupled to the control gate of the fuse elements. In another aspect of the present invention, the clamp is operable during reads.

In one aspect of the present invention, a forcing circuit forces the fuse elements to a particular state.

In one aspect of the present invention, the control gate of one of the first and second fuse elements is set to a reference voltage. A reference value of the control gate of the other of the fuse elements is compared by the corresponding latch of the memory cell.

In one aspect of the present invention, a signal that is applied to the memory cells is set at a voltage to stress the memory cells.

In one aspect of the present invention, a plurality of memory devices may be coupled together.

BRIEF DESCRIPTION OF THE DRAWINGS

FIG. 4 is a block diagram of a fuse apparatus with one input/output in accordance with the present invention.

FIG. 5 is a schematic diagram of an equalization network according to the present invention.

FIG. 6 is a schematic diagram of a resistor-capacitor (RC) filter network according to the present invention.

DETAILED DESCRIPTION

Figure 1:
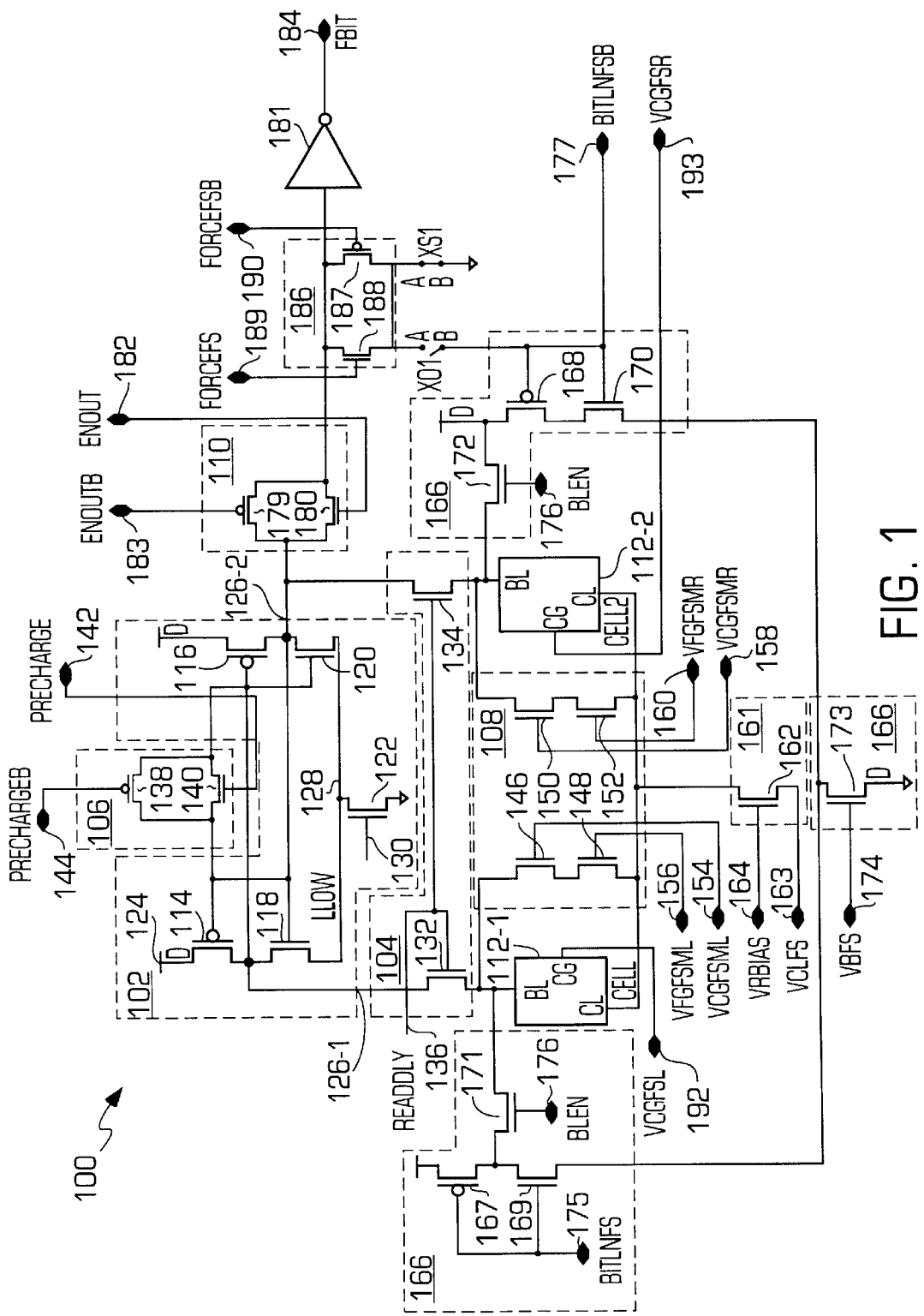
FIG. 1 is a schematic diagram of a fuse cell element according to the present invention.

FIG. 1 is a schematic diagram of a fuse cell element 100 according to the present invention. The fuse cell element 100 comprises a latch 102, an isolation circuit 104, a precharge circuit 106, a margin circuit 108, an isolation transfer gate 110, and memory cells 112-1 and 112-2.

In one embodiment, the latch 102 and the memory cells 112-1 and 112-2 are in a constant current differential sensing arrangement, in which an input pair of a differential comparator is replaced by a fuse pair (e.g., the memory cells 112-1 and 112-2). The difference in the floating gate voltage of the fuse pair (the memory cells 112-1 and 112-2) generates the input differential voltage. Accordingly, the comparator output is an accurate indication of the fuse pair output. Well-known advantages of a true differential comparator, such as constant bias current, noise insensitivity to power supply fluctuation, and common mode rejection, are thus preserved in this fuse sensing arrangement. Constant bias current is advantageous in terms of power layout distribution (such as metal width) and low power consumption. Furthermore, the fuse pair may include a cross-coupled fuse pair to average out the effects of electrical differences between the fuse pair due to processing and physical location, such as bottom and top fuse locations, on a memory device, which improves yield and reliability.

The sensing scheme further allows all the terminals of the fuse to be at zero voltage in standby and to be the same as the default operating condition of regular memory cells, and thus it has a similar data retention behavior. This is advantageous since this state is well known for regular memory cells. The sensing scheme has two phases. The first phase is active (with bias current and voltage) sensing by the differential comparator to amplify a floating gate voltage differential in the input fuse pair. The second phase is constant current latching amplification by enabling a current controlled cross coupled built-in latch (e.g., latch 102) to then completely open up the output voltage to full rail and isolate the fuse cells from the latch 102 by shutting off the pass gate (e.g., the isolation circuit 104) from fuse cells to the latch 102. The built-in latch refers to the latching PMOS transistors (e.g., PMOS transistors 114 and 116 described below) as part of the differential comparator. The constant current latching amplification refers to the latch amplification at a fixed bias current.

The sensing scheme can alternately allow the fuse cells (memory cells 112) to be in an on-condition, namely fuse cells in operating condition (voltages on control gate and bit line), by not isolating the fuse cells from the latch 102 (e.g., by not shutting off the pass gates of the isolation circuit 104 from the fuse cells, memory cells 112, to the latch 102).

In one embodiment, the sensing scheme can also use one logic signal edge triggered from a power-on-reset (POR) signal (not shown) to control the sensing. In this embodiment, as the power-on-reset (POR) signal transitions from high to low, as the supply voltage VCC transitions from low to high, the built-in latch 102 and the differential comparator are on. When the voltage VCC is turning on and as the power-on-reset (POR) signal transitions from high to low at the VCC trip point, the built-in latch 102 then opens up the output to full rail. The fuse cells (memory cells 112) can then operate (voltages on the control gate and bit line). Alternatively, the sensing scheme may use a logic signal triggered from an on-chip or off-chip control logic circuit (not shown) to control the sensing.

In one embodiment, the first and second memory cells 112-1, 112-2 are programmable non-volatile fuse elements. In one embodiment, the memory cells 112-1, 112-2 are source side hot electron injection flash memory. In one embodiment, the memory cells 112-1, 112-2 are split gate memory cells. A fuse control gate voltage (VCGFSL) 192 is applied to the memory cell 112-1 to control the control gate (CG) thereof. A fuse control gate voltage (VCGFSR) 193 is applied to the memory cell 112-2 to control the control gate (CG) thereof.

The latch 102 detects the contents stored in the memory cells 112-1, 112-2 and latches the read contents allowing the memory cells 112-1, 112-2 to be electrically disconnected from the latch 102 by the isolation circuit 104. The latch 102 comprises p-channel metal oxide semiconductor field effect transistors (PMOS transistors) 114, 116 and n-channel metal oxide semiconductor field effect transistors (NMOS transistors) 118, 120, 122. The drain-source terminals of the PMOS transistors 114, 116 are coupled between a power supply line 124 and a first latch input 126-1 and a second latch input 126-2, respectively. The drain-source terminals of the NMOS transistors 118, 120 are coupled between the first and second latch inputs 126-1 and 126-2, respectively, and a common node 128. The gates of the PMOS transistor 114 and the NMOS transistor 118 are coupled together and to the second latch input 126-2. The gates of the PMOS transistor 116 and the NMOS transistor 120 are coupled together and to the first latch input 126-1. The NMOS transistor 122 includes drain-source terminals coupled between the common node 128 and ground, and includes a gate coupled to a latch signal 130. The NMOS transistor 122 controls the current of the latch 102 during sensing, and functions as a logic switch during latching.

The isolation circuit 104 isolates the memory cells 112-1, 112-2 during standby and isolates the latch 102 from a write circuit (not shown) during write. In one embodiment, the isolation circuit 104 comprises NMOS transistors 132 and 134 including drain-source terminals coupled between the respective first and second latch inputs 126-1, 126-2 and a bit line (BL) terminal of the respective first and second memory cells 112-1, 112-2, and including a gate coupled to a read delay (READDLY) signal 136. The read delay signal 136 is set at a time after the memory cells 112 are read sufficient for the latch 102 to latch the read content of the memory cells 112. The read delay signal 136 also is set during standby and during writes to the memory cells 112.

The precharge circuit 106 precharges the voltage applied to the latch 102 and the latch inputs 126 before reading the memory cells 112. In one embodiment, the precharge circuit 106 comprises a PMOS transistor 138 and an NMOS transistor 140 coupled together as a transfer gate between the gates of the PMOS transistors 114, 116. The gates of the NMOS transistor 140 and the PMOS transistor 138 are controlled by a precharge signal 142 and an inverted precharge signal (PRECHARGEB) 144, respectively. During precharge, the PMOS transistor 138 and the NMOS transistor 140 equalize the voltage on the first and second latch inputs 126-1 and 126-2.

The margin circuit 108 provides a current to the latch 102 sufficient to ensure that a definite margin voltage exists between the pair of memory cells 112-1, 112-2. In one embodiment, the margin circuit 108 comprises NMOS transistors 146, 148, 150, 152. The drain-source terminals of the NMOS transistors 146, 148 are coupled together in series, and the series connected NMOS transistors 146, 148 are coupled in parallel between the bit line (BL) terminal and a common line (CL) terminal of the memory cell 112-1. The gates of the NMOS transistors 146, 148 are coupled to receive a first fuse control gate margin control (VCGFSML) signal 154 and a first fuse floating gate margin control (VFGFSML) signal 156, respectively. The drain-source terminals of the NMOS transistors 150, 152 are coupled together in series, and the series connected NMOS transistors 150, 152 are coupled in parallel between the bit (BL) terminal and the common line (CL) terminal of the memory cell 112-2. The gates of the NMOS transistors 150, 152 are coupled to receive a second fuse control gate margin control (VCGFSMR) signal 158 and a second fuse floating gate margin control (VFGFSMR) signal 160, respectively.

The fuse cell element 100 also has a mass margining feature to ensure a definite margin voltage exists between the fuse pair (memory cells 112-1, 112-2). Mass margining refers to all fuses (in a predefined portion of the memory, such as all in a bank or page or device) being exercised at the same time, resulting in shortened test time. The NMOS transistors 146, 148 and the NMOS transistors 150, 152 function as dummy transistors which are a pair of series connected transistors that are connected in parallel with the respective memory cells 112-1, 112-2. One dummy transistor simulates a control gate transistor of a memory cell 112. The other dummy transistor simulates a floating gate transistor of the memory cell 112. By comparing a reference voltage on the dummy pair of NMOS transistors 146, 148 and the control gate voltage 193 of the memory cell 112-2, and likewise by comparing a reference voltage on the dummy pair of NMOS transistors 150, 152 and the control gate voltage 192 of the memory cell 112-1, the state of the pair of memory cells 112-1, 112-2 is known. Hence, a definite voltage is observed which is related to the margin of the memory cell fuse pair. This definite voltage is called the voltage of the memory cell to more easily explain the fuse cell element and its operation.

In an alternate embodiment, mass margining applies a current offset from the supply voltage $V_{CC}$ on the power supply line 124 or from a ground line to the bit line of one of the memory cells 112-1 and 112-2 during sensing. A MOS transistor (not shown) includes drain-source terminals coupled between the power supply line 124 or the ground line and the bit line of one of the memory cells 112-1 and 112-2, and includes a gate biased at a certain voltage.

The fuse apparatus can also allow multilevel fuse sensing by setting an appropriate reference voltage on one fuse control gate and comparing it against a reference value on the other fuse control gate (or against a reference value on the dummy transistor gate of the other side) of the differential comparator.

In one multilevel fuse sensing embodiment, one of the fuse control gate voltages 192 or 193 of one of the memory cells 112-1, 112-2 is set to an appropriate reference voltage, and compared against a reference value on the control gate of the other of the memory cells 112-1, 112-2. In another embodiment, the comparison is against a reference value on the gate on one of the NMOS transistors 146, 148, 150, 152 corresponding to the control gate of the other of the memory cells 112-1, 112-2.

The fuse may be programmed using a constant current mass fuse programming, in which all the bias currents to all fuses are provided at the same time for programming to save time. In one embodiment described below in conjunction with FIG. 3, the read/write signals 302 are applied to each fuse cell element 301-0 through 301-7. In one embodiment, the fuse bias voltage (VBFS) 174 is applied to each fuse cell element 100 of the fuse cell elements 301-0 through 301-7. In another embodiment described below in conjunction with FIG. 4, the read/write signals 402 are applied to each fuse cell element 401-0 through 401-8. In one embodiment, the fuse bias voltage (VBFS) 174 is applied to each fuse cell element 100 of the fuse cell elements 401-0 through 401-8.

As an illustrative example, setting the fuse control gate voltage (VCGFSL) 192 and the fuse control gate voltage (VCGFSR) 193 equal to each other and equal to approximately 1.5 volts, a difference in the floating gate voltages causes the latch 102 to flip according to the difference. In one embodiment, the floating gate difference is obtained by erasing one of the memory cells 112-1, 112-2 and programming the other to store one binary state of the fuse element or reversing the program and erase state of the memory cell pair to store the opposite fuse state. In one embodiment, the fuse margin is tested to ensure the fuse memory cells 112 have sufficient margin voltage difference to prevent the floating gates from losing the information, and thus preventing the latch 102 from flipping incorrectly.

In one embodiment, the fuse margin test is performed to verify that an erased memory cell 112 has a certain difference margin voltage. For the sake of illustration in this margin test, the memory cell 112-1 is erased. The fuse control gate voltage (VCGFSR) 193 is set to 0 volts to turn off the memory cell 112-2. The fuse control gate voltage (VCGFSL) 192 is set to the operating voltage, e.g., 1.5 volts. The first fuse control gate margin control (VCGFSML) signal 154 applied to the NMOS transistor 146 and the first fuse floating gate margin control (VFGFSML) signal 156 applied to the NMOS transistor 148 are set to zero. The second fuse control gate margin control (VCGFSMR) signal 158 applied to the NMOS transistor 150 is set to the operating voltage, e.g., 1.5 volts. In order to observe the voltage of the memory cell 112-1, the second fuse floating gate margin control (VFGFSMR) signal 160 is varied until the voltage on the second latch input 126-2 switches from high to low. At this event, the voltage of the first memory cell 112-1 equals the voltage applied to the NMOS transistor 152, i.e., the second fuse floating gate margin control (VFGFSMR) signal 160.

In order to test that the voltage of the memory cell 112-1 is greater than the margin voltage for more reliable operation, the second fuse floating gate margin control (VFGFSMR) signal 160 is set equal to a predetermined first voltage margin, and the voltage of the memory cell 112-1 is greater than the desired voltage margin if the voltage on the latch input at 126-2 is still high.

In one embodiment, the fuse margin test is performed to verify that a programmed memory cell 112 has a certain difference margin voltage. For the sake of illustration in this margin test, the memory cell 112-1 is programmed. The fuse control gate voltage (VCGFSR) 193 is set to 0 volts to turn off the memory cell 112-2. The fuse control gate voltage (VCGFSL) 192, the second fuse control gate margin control (VCGFSMR) signal 158 applied to the NMOS transistor 150, and the first fuse control gate margin control (VCGFSML) signal 154 applied to the NMOS transistor 146 are set to the operating voltage, e.g., 1.5 volts. In order to observe the voltage of the memory cell 112-1, the second fuse floating gate margin control (VFGFSMR) signal 160 is set to a value which simulates a predetermined weakly erased but still acceptably reliable memory cell. The first fuse floating gate margin control (VFGFSML) signal 156 applied to the NMOS transistor 148 is varied until the voltage on the second latch input 126-2 switches from low to high. At this event, the voltage of the first memory cell 112-1 equals the voltage applied to the NMOS transistor 148, i.e., the first fuse floating gate margin control (VFGFSML) signal 156.

In order to test that the voltage of the memory cell 112-1 is greater than the margin voltage desired for more reliable operation, the first fuse floating gate margin control (VFGFSML) signal 156 is set equal to a predetermined first voltage margin, and the voltage of the memory cell 112-1 is greater than the voltage margin if the voltage on the second latch input 126-2 is still low.

In another embodiment, the fuse margin test is again performed to verify that a programmed memory cell 112 has a certain difference margin voltage. For illustration, the memory cell 112-1 is again programmed. The fuse control gate voltage (VCGFSR) 193 is set to 0 volts to turn off the memory cell 112-2. The first fuse control gate margin control (VCGFSML) signal 154 applied to the NMOS transistor 146 and the first fuse floating gate margin control (VFGFSML) signal 156 applied to the NMOS transistor 148 are set to zero. The fuse control gate voltage (VCGFSL) 192 and the second fuse control gate margin control (VCGFSMR) signal 158 applied to the NMOS transistor 150 are set to the operating voltage, e.g., 1.5 volts. In order to observe the voltage of the memory cell 112-1, the second fuse floating gate margin control (VFGFSMR) signal 160 is set to a value which simulates a predetermined weakly erased but still acceptably reliable memory cell. If the voltage on the first latch input 126-1 is high, then the voltage of the first memory cell 112-1 is less than the first margin voltage. The fuse control gate voltage (VCGFSL) 192 is set to a higher voltage, e.g., 3.5 volts. If the voltage on the first latch input 126-1 is high, then the voltage of the first memory cell 112-1 is less than the second margin voltage. The voltage margin equals the difference between the two tested voltages multiplied by a control gate coupling ratio. In this example, the margin voltage is 0.4 volts (equals a coupling ratio of 0.2 times the difference between the 3.5 volts and the 1.5 volts). Thus the voltage of the first memory cell 112-1 has at least a margin voltage equal to 0.4 volts.

The margin of the entire fuse element 100 is a function of the margins for both memory cells 112-1 and 112-2. Thus, similar procedures are performed to test the margin of the complementary memory cell. The present invention allows both memory cell margins to be tested independently, such as the testing described above. In another embodiment, the fuse margin is tested by the differential swing in the voltages applied to the control gate. The fuse control gate voltage (VCGFSL) 192 applied to the first memory cell 112-1 and the fuse control gate voltage (VCGFSR) 193 applied to the second memory cell 112-2 are swung in opposite directions by a voltage $V_M$ and the state of the latch (e.g., the voltage on the first latch input 126-1 and the second latch input 126-2) are tested. The margin voltage equals a fixed coupling ratio times the voltage $V_M$.

The fuse cell element 100 further comprises a read bias current circuit 161, a programming inhibit circuit 166, an inverter 181, and a fuse forcing circuit 186. The read bias current circuit 161 provides bias current for reading of the memory cells 112. In one embodiment, the read bias current circuit 161 comprises an NMOS transistor 162. The NMOS transistor 162 includes drain-source terminals coupled between the common line (CL) input terminals of the memory cells 112-1, 112-2 and a fuse common line terminal voltage (VCLFS) signal 163, and includes a gate coupled to a read bias voltage (VRBIAS) 164.

The programming inhibit circuit 166 inhibits the programming of the memory cells 112-1, 112-2. In one embodiment, the programming inhibit circuit 166 comprises PMOS transistors 167, 168 and NMOS transistors 169, 170, 171, 172, 173.

The NMOS transistor 173 provides bias current for programming the memory cells. Specifically, the NMOS transistor 173 includes drain-source terminals coupled between the common node formed of the source terminals of the NMOS transistors 169, 170 and ground, and includes a gate coupled to receive a fuse bias voltage (VBFS) 174.

The drain-source terminals of the PMOS transistor 167 and the NMOS transistor 169 are series coupled between the power supply line 124 and the drain terminal of the NMOS transistor 173. The gates of the PMOS transistor 167 and the NMOS transistor 169 are coupled together and to a fuse bit line signal (BITLNFS) 175.

The NMOS transistor 171 isolates the memory cell 112-1 from the read circuit during read. The NMOS transistor 171 includes drain-source terminals coupled between the bit line (BL) terminal of the memory cell 112-1 and the common node formed of the PMOS transistor 167 and the NMOS transistor 169, and includes the gate coupled to receive a bit line enabled (BLEN) signal 176.

The drain-source terminals of the PMOS transistor 168 and the NMOS transistor 170 are series coupled between the power supply line 124 and the drain terminal of the NMOS transistor 173. The gates of the PMOS transistor 168 and the NMOS transistor 170 are coupled together and to an inverted fuse bit line signal (BITLNFSB) 177.

The NMOS transistor 172 isolates the memory cell 112-2 from the read circuit during read. The NMOS transistor 172 includes drain-source terminals coupled between the bit line (BL) terminal of the memory cell 112-2 and the common node formed of the PMOS transistor 168 and the NMOS transistor 170, and includes a gate coupled to receive the bit line enabled (BLEN) signal 176.

The isolation transfer gate 110 isolates the sensing circuit (the latch 102) from the external circuits. In one embodiment, the isolation transfer gate 110 comprises a PMOS transistor 179 and NMOS transistor 180 coupled together as a transfer gate between the second latch input 126-2 and the input of the inverter 181. The gates of the PMOS transistor 179 and the NMOS transistor 180 are controlled by complimentary enable output signals (ENOUT, ENOUTB) 182 and 183, respectively. The inverter 181 provides an output (FBIT) signal 184 indicative of the contents of the memory cells 112.

The fuse forcing circuit 186 forces memory cells 112-1, 112-2 to selected storage states. In one embodiment, the fuse forcing circuit 186 comprises a PMOS transistor 187 and an NMOS transistor 188. The NMOS transistor 188 and the PMOS transistor 187 are coupled together as a transfer gate between the common node of the isolation transfer gate 110 and the input of the inverter 181 and selectively to either ground or the fuse bit line signal (BITLNFSB) terminal 177. The gates of the NMOS transistor 188 and the PMOS transistor 187 are coupled to a fuse forcing (FORCEFS) signal 189 and an inverted fuse forcing (FORCEFSB) signal 190, respectively, to enable the fuse force circuit 186.

The fuse cell element 100 may be used for multi-level voltage storage of multiple bits per cell. The voltages applied to the memory cells 112-1, 112-2 are controlled by applying the multiple bits to a digital-to-analog converter (not shown) for applying an analog voltage to the memory cells 112. Likewise, memory cells 112 may be read by converting the voltage therefrom into multiple bits by an analog-to-digital converter (not shown). The multi-level fuse cells may be used in circuits having a plurality of fuse cell elements 100, such as those described below in conjunction with FIGS. 3 and 4.

Figure 2:
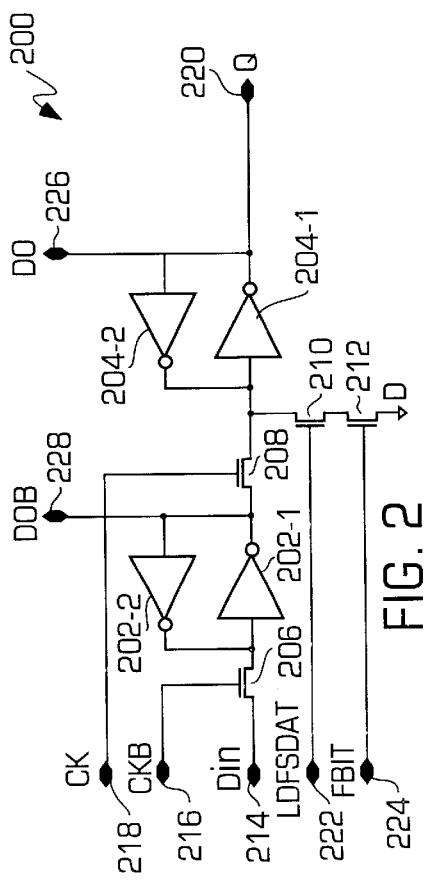
FIG. 2 is a schematic diagram of a latch for serial byte shifting data in and out of a serial port according to the present invention.

FIG. 2 is a schematic diagram of a latch 200 for a serial byte shifting data in and out of a serial ports 326 and 328 (see FIG. 3) and serial ports 426 and 428 (see FIG. 4). The latch 200 is used for latching and controlling the fuses of FIG. 1. Further the latch 200 can be used to test the memory cells 112, such as stress test, and to verify a band gap circuit (not shown).

The latch 200 comprises a first inverter pair 202-1 and 202-2, a second inverter pair 204-1, 204-2, and NMOS transistors 206, 208, 210, 212. The inverters 202-1, 202-2 are cross-coupled so that the output of one of the inverters is connected to the input of the other inverter. The inverters 204-1, 204-2 are similarly cross-coupled. The NMOS transistor 206 includes drain-source terminals coupled between a data input (Din) terminal 214 and the input of the inverter 202-1, and includes a gate coupled to an inverted clock (CKB) signal 216. The NMOS transistor 206 operates as an isolation and transfer gate between the data input and the first inverter pair 202 in response to the inverted clock (CKB) signal 216. The NMOS transistor 208 includes drain-source terminals coupled between the output of the inverter 202-1 and the input of the inverter 204-1, and includes a gate coupled to a clock (CK) signal 218, which is inverted from the inverted clock signal 216. The NMOS transistor 208 operates as an isolation and transfer gate between the first and second inverter pairs 202 and 204, respectively, in response to the clock signal 218. The output of the inverter 204-1 is coupled to an output (Q) terminal 220. The NMOS transistors 210, 212 include drain-source terminals connected in series between the input of the inverter 204-1 and ground. The gate of the NMOS transistor 210 is coupled to a load fuse data (LDFSDAT) signal terminal 222. The gate of the NMOS transistor 212 is coupled to a fuse bit (FBIT) signal terminal 224. A data output (DO) signal terminal 226 is coupled to the output of the inverter 204-1. An inverted data output (DOB) signal terminal 228 is coupled to the output of the inverter 202-1. In one embodiment, a fuse apparatus comprises a fuse cell element 100 and a latch 200.

The data input terminal 214 and the output terminal 220 are coupled to serial data in and serial data output terminals of the fuse apparatus. In another embodiment, a fuse apparatus comprises a plurality of fuse cell elements 100 and a plurality of latches 200. The latches 200 are coupled together in series so that the data input terminal 214 of the first latch 200 is coupled to the serial data input of the fuse apparatus and the output terminal 220 of each of the first through the next-to-last latches 200 is coupled to the serial input 214 of the next latch 200. The output terminal 220 of the last latch 200 is coupled to the serial output of the fuse apparatus. Two embodiments of fuse apparatus are described in conjunction with FIGS. 3 and 4.

Figure 3:
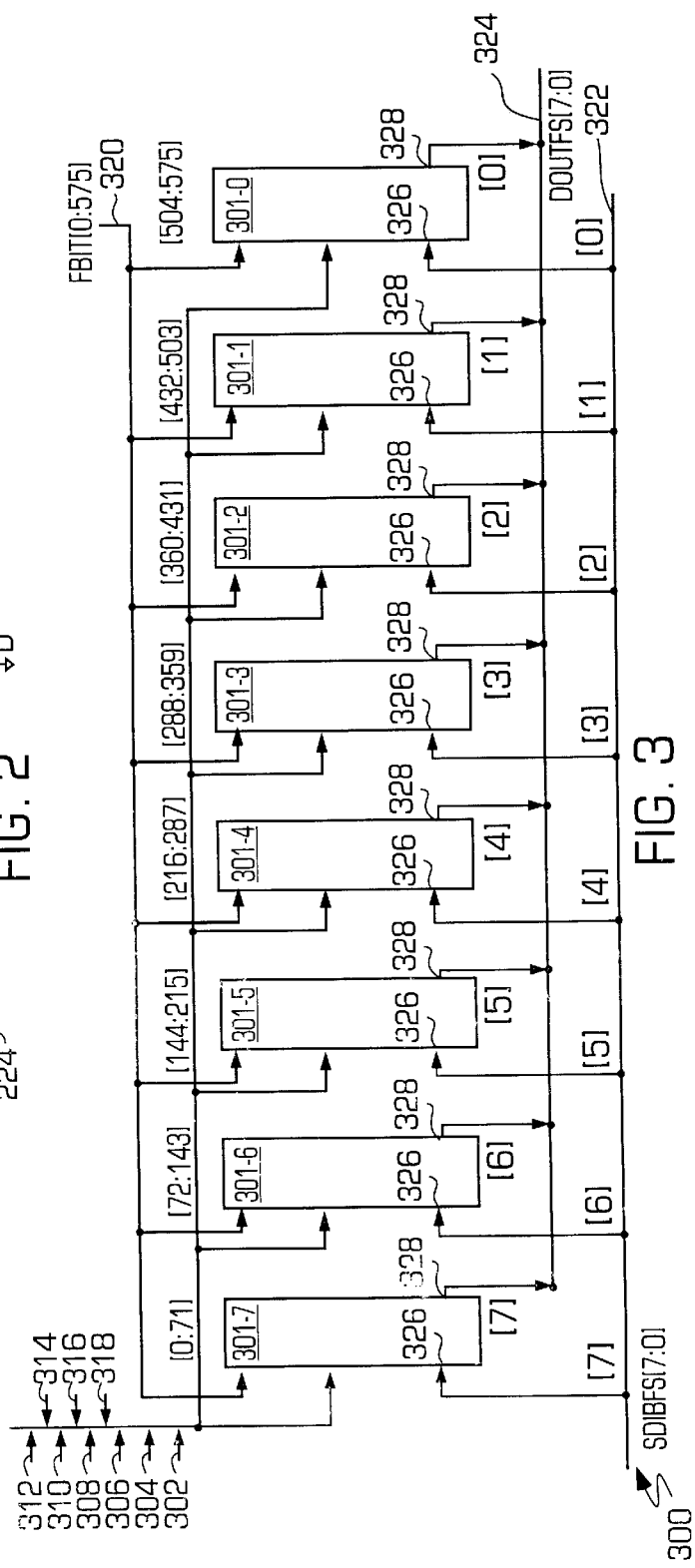
FIG. 3 is a block diagram of a fuse apparatus with eight input/outputs in accordance with the present invention.

FIG. 3 is a block diagram of a fuse apparatus 300 with eight input/outputs in accordance with the present invention. The fuse apparatus 300 includes eight parallel serial data inputs and eight parallel serial data outputs. The present invention is not limited to eight, and other numbers of parallel serial data inputs and outputs may be used. The fuse apparatus 300 includes arrays of memory cells. The fuse apparatus 300 comprises a plurality of fuse cell elements 301-0 through 301-7. Each fuse cell element 301-0 through 301-7 includes a plurality of the fuse cell elements 100 and the latches 200. Each fuse cell element 301-0 through 301-7 is coupled to receive a plurality of control signals and voltages. In one embodiment, each fuse cell element 301 receives read/write signals 302, precharge signals 304, margin control signals 306, read bias signals 308, output control signals 310, fuse forcing signals 312, fuse control gate voltages 314, latch control signals 316, a strap control gate voltage signal 318, a fuse bit (FBIT) signal 320, and a serial data input (SDIBFS[7:0]) signal 322. The fuse cell elements 301 generate a data output (DOUTFS[7:0]) signal 324 at a serial data output port 328.

The read/write signals 302 may include, for example, the latch signal 130, the read delay (READ DLY) signal 136, the fuse bias voltage (VBFS) 174, and the bit line enabled (BLEN) signal 176.

The precharge signals 304 may include, for example, the precharge signal 142 and the inverted precharge (PRECHARGE B) signal 144.

The margin control signals 306 may include, for example, the first fuse control gate margin control (VCGFSML) signal 154, the first fuse floating gate margin control (VFGFSML) signal 156, the second fuse control gate margin control (VCGFSMR) signal 158, and the second fuse floating gate margin control (VFGFSMR) signal 160.

The read bias signals 308 may include, for example, the fuse CL terminal voltage (VCLFS) signal 163 and the read bias voltage (VRBIAS) 164.

The output control signals 310 may include, for example, the enable output (ENOUT) signal 182 and the inverted enable output (ENOUTB) signal 183.

The fuse forcing signals 312 may include, for example, the fuse forcing (FORCEFS) signal 189 and the inverted fuse forcing (FORCEFSB) signal 190.

The fuse control gate voltages 314 may include, for example, the fuse control gate voltage (VCGFSL) 192 and the fuse control gate voltage (VCGFSR) 193.

The latch control signals 316 may include, for example, the clock signal (CK) 218, the inverted clock signal (CKB) 216, and the load fuse data (LDFSDAT) signal 222.

The strap control gate voltage (VCGSTRAP) signal 318 is coupled to the fuse cell elements 301 for controlling the voltage applied to the control gate of the fuse cell elements 301 by shorting the control gates of the memory cells 112-1 and 112-2 therein together (see description related to FIG. 5 below).

The fuse bit (FBIT[0:575]) signal 320 includes the fuse bit (FBIT) signals 224 for each latch 200 in the corresponding fuse cell element 301.

The serial data input (SDIBFS[7:0]) signal 322 is applied to a serial data port 326 for coupling to the latches 200 in the fuse cell elements 301. Specifically, the serial data input (SDIBFS[7:0]) signal 322 is coupled via the serial data output port 328 to the data input signal 214 of latches 200.

The data output (DOUTFS[7:0]) signal 324 is coupled to the latches 200 in the fuse cell elements 301. Specifically, the serial data input (SDIBFS[7:0]) signal 322 is coupled to the data output signal 226 of latches 200.

FIG. 4 is a block diagram of a fuse apparatus 400 with one input/output in accordance with the present invention and an equalization network 403. The fuse apparatus 400 includes a single serial data input and a serial data output.

The fuse apparatus 400 comprises a plurality of fuse cell elements 401-0 through 401-8 and an equalization network 403. Each fuse cell element 401-0 through 401-8 includes a plurality of the fuse cell elements 100 and the latches 200. Each fuse cell element 401-0 through 401-8 is coupled to receive a plurality of control signals and voltages. In one embodiment, each fuse cell element 401 receives read/write signals 402, precharge signals 404, margin control signals 406, read bias signals 408, output control signals 410, fuse forcing signals 412, fuse control gate voltages 414, latch control signals 416, a fuse bit (FBIT) signal 420, a serial data input (SDI) signal 422. The fuse cell elements 401-0 through 401-8 generates a data output (SDO) signal 424-0 through 424-8 at a serial data output port 428. In one embodiment, the equalization network 403 is the equalization network 500 described below in conjunction with FIG. 5.

The read/write signals 402 may include, for example, the latch signal 130, the read delay (READ DLY) signal 136, the fuse bias voltage (VBFS) 174, and the bit line enabled (BLEN) signal 176.

The precharge signals 404 may include, for example, the precharge signal 142 and the inverted precharge (PRECHARGEB) signal 144.

The margin control signals 406 may include, for example, the first fuse control gate margin control (VCGFSML) signal 154, the first fuse floating gate margin control (VFGFSML) signal 156, the second fuse control gate margin control (VCGFSMR) signal 158, and the second fuse floating gate margin control (VFGFSMR) signal 160.

The read bias signals 408 may include, for example, the fuse CL terminal voltage (VCLFS) signal 163 and the read bias voltage (VRBIAS) 164.

The output control signals 410 may include, for example, the enable output (ENOUT) signal 182 and the inverted enable output (ENOUTB) signal 183.

The fuse forcing signals 412 may include, for example, the fuse forcing (FORCEFS) signal 189 and the inverted fuse forcing (FORCEFSB) signal 190.

The fuse control gate voltages 414 may include, for example, the fuse control gate voltage (VCGFSL) 192 and the fuse control gate voltage (VCGFSR) 193.

The latch control signals 416 may include, for example, the clock signal (CK) 218, the inverted clock signal (CLB) 216, and the load fuse data (LDFSDAT) signal 222.

A strap control gate voltage (VCGSTRAP) signal 418 is coupled to the equalization network 403 for controlling the voltage applied to the control gate of the fuse cell elements 401 by shorting the control gates of the memory cells 112-1 and 112-2 therein (see FIG. 5 below) together. Specifically, the equalization network 403 shorts the fuse control gate voltages 414 together in response to the strap control gate voltage 418.

The fuse bit (FBIT[0:575]) signal 420 includes the fuse bit (FBIT) signals 224 for each latch 200 in the corresponding fuse cell element 401.

The serial data input (SDI) signal 422 is applied to a serial data input port 426 for coupling to the latches 200 in the fuse cell element 401-8. The serial data input (SDI) signal 422 is coupled via the serial data output port 426 to the data input signal 214 of the latch 200 of the fuse cell element 401-8.

Each fuse cell element 401-1 through 401-8 provides a data output (SDO) signal 424-0 through 424-8, respectively, to the serial data input of the subsequent fuse cell element 401, and correspondingly to the serial data input 214 of the latch 200 therein. The data output (SDO) signals 424-0 through 424-8 are provided by the data output signal 226 of the latches 200 in the respective fuse cell elements 401-0 through 401-8. The serial data input (SDI) signal 422 is coupled to the data input signal 214 of the latch 200 of the fuse cell element 401-8.

To stabilize the control gate voltages on the fuse pair in sensing from noises and delay, a clamped RC-filter network 600 (see FIG. 6) and an equalized network 500 (see FIG. 5) is used on the control gates of the memory cells at every certain distance.

FIG. 5 is a schematic diagram of an equalization network 500 according to the present invention. The equalization network 500 may be coupled to the control gates of the memory cells 112-1, 112-2 to short the control gates of the memory cells 112-1, 112-2 together. The equalization network 500 comprises PMOS transistors 502, 504. The drain-source terminals of the PMOS transistors 502, 504 are coupled together in series between the fuse control gate voltage (VCGFSL) signal 192 and the fuse control gate voltage (VCGFSR) signal 193, which are coupled to the control gates of the memory cells 112-1 and 112-2, respectively, as described above in conjunction with FIG. 1. The gates of the PMOS transistors 502 and 504 are coupled together and coupled to a strap control gate voltage (VCGSTRAP) signal 506, which when enabled couple the control gates of the memory cells 112-1 and 112-2 together to equalize a control voltage applied to the first and second memory cells 112-1 and 112-2, respectively. In memory devices or systems with multiple memory cells 112-1 and 112-2, such as described above in conjunction with FIGS. 3 and 4, equalization networks 500 may be connected to a corresponding group of memory cells physically or electrically spaced apart.

FIG. 6 is a schematic diagram of a resistor-capacitor (RC) filter network 600 according to the present invention. The RC filter network 600 comprises a plurality of resistors 602-1, 602-2 and a plurality of capacitors 604-1 through 604-4. For the sake of illustration, two resistors 602 and four capacitors 604 are shown. The resistors 602 are selectively connected serially or in parallel between an input terminal and an output terminal to form a desired equivalent resistance. The capacitors 604 are selectively connected between the output terminal and ground serially or in parallel to form a desired equivalent capacitance.

Figure 7:
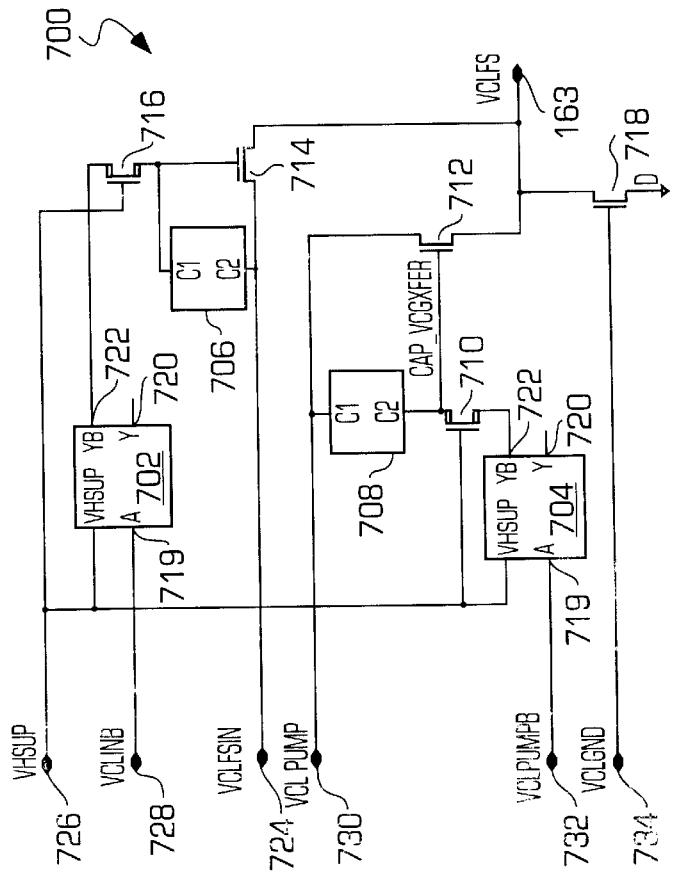
FIG. 7 is a schematic diagram of a control circuit for a fuse common line of the fuse cell element of FIG. 1 according to the present invention.

FIG. 7 is a schematic diagram of a control circuit 700 for the fuse common line terminal voltage signal 163. The control circuit 700 comprises voltage shift stages 702, 704, capacitors 706 and 708, and NMOS transistors 710, 712, 714, 716, 718.

The voltage shift stages 702, 704 (described below in conjunction with FIG. 11) provide a voltage shift that accepts a voltage value of ground or power supply Vcc at an input terminal 719 and outputs a voltage value of ground or high voltage (VHSUP) at an output terminal 720. A terminal 722 provides an output that is complementary to the output of the output terminal 720.

The control circuit 700 uses a high voltage (HV) transceiver scheme to transmit and/or receive the high voltage that is typically higher than the allowed voltage value, such as an allowed voltage across an NH type high voltage transistor gate oxide may be 8V. An exemplary HV transceiver comprises the voltage shift stage 702, the NMOS transistors 714, 716 and the capacitor 706. The drain-source terminals of the NMOS transistor 714 couple a common line fuse input voltage (VCLFSIN) 724 to the fuse CL terminal voltage (VCLFS) signal 163. The voltage shift circuit 702 and the NMOS transistor 716 precharges a high voltage VHSUP-VTN, e.g. 10V−VTN=~8V, at the gate of the NMOS transistor 714 in response to a common line input voltage (VCLINB) 728. A high voltage supply voltage (VHSUP) 726 is applied to the voltage shift stages 702 and 704 and the gates of the NMOS transistors 710 and 716. The drain-source terminals of the NMOS transistor 716 couples the inverted output terminal 722 of the voltage shift stage 702 to the gate of the NMOS transistor 714 for the precharging. The capacitor 706 is coupled between the common line input voltage (VCLFSIN) 724 and the gate of the NMOS transistor 714. The common line input voltage (VCLINB) 728 is applied to the input terminal 719 of the voltage shift stage 702. Then as the voltage at (VCLFSIN) 724 transitions from low, e.g. 0V, to high, e.g. 10V, the capacitor 706 bootstraps the voltage on the gate of the NMOS transistor 714 from VHSUP-VTN up to 18V allowing the common line fuse input voltage (VCLFSIN) 724 to fully pass the voltage at the common line fuse input voltage (VCLFSIN) 724 into the fuse CL terminal voltage (VCLFS) signal 163. The voltage across the gate oxide of the NMOS transistor 714 is still only at a maximum of 8V thereby ensuring more reliable operation.

The voltage shift stage 704, the NMOS transistors 710 and 712 and the capacitor 708 form another high voltage transceiver in an arrangement similar to that of the voltage shift stage 702, the NMOS transistors 716 and 714 and the capacitor 706, respectively. The drain-source terminals of the NMOS transistor 712 couple a common line pump voltage (VCL pump) 730 to the fuse CL terminal voltage (VCLFS) signal 163. The voltage shift stage 704 and the NMOS transistor 710 precharges a high voltage VHSUP-VTN on the gate of the NMOS transistor 712 in a manner similar to that described above for the voltage shift stage 702 and the NMOS transistor 716. A common line pump voltage (VCLPUMPB) 732 is applied to the input terminal 719 of the voltage shift stage 704.

A common line ground voltage control (VCLGND) 734 is applied to the gate of the NMOS transistor 718, which includes drain-source terminals coupled between the common line fuse voltage (VCLFS) 163 and ground, to ground the common line fuse voltage (VCLFS) 163.

Figure 8:
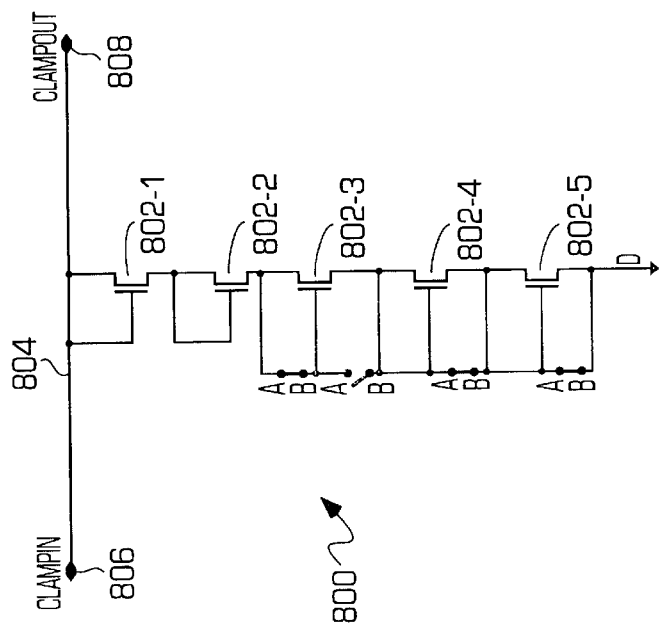
FIG. 8 is a schematic diagram of a clamp according to the present invention.

FIG. 8 is a schematic diagram of a clamp 800 according to the present invention. In one embodiment, a clamp 800 is coupled in the fuse control gate voltage line (VCGFSL) 192, and a clamp 800 is coupled in the fuse control gate voltage line (VCGFSR) 193. The clamp 800 limits the voltage applied to the control gate of the memory cell 112 during reading. The clamp 800 comprises a plurality of NMOS transistors 802-1 through 802-5. For the sake of illustration, five NMOS transistors 802 are shown and described. Other numbers of NMOS transistors 802 may be used. The drain-source terminals of the NMOS transistor 802-1 through 802-5 are coupled together in series between a clamp signal line 804 and ground. The clamp signal line 804 is coupled between a clamp input terminal 806 and a clamp output terminal 808. The drain terminal of each NMOS transistor 802-1 through 802-5 is coupled to the gate thereof. A switch is coupled between the gate of the NMOS transistor 802-3 and the drain of the NMOS transistor 802-4. Likewise, a switch similarly is coupled between the NMOS transistors 802-4 and 802-5. A switch is coupled between the gate and source terminals of the NMOS transistor 802-5. Using these switches, selected ones of the NMOS transistors 802-3 through 802-4 may be electrically bypassed or disconnected from the clamp 800 to thereby change the characteristics of the clamp 800. In other embodiments, switches may be coupled between transistors other than those shown in FIG. 8.

Figure 9:
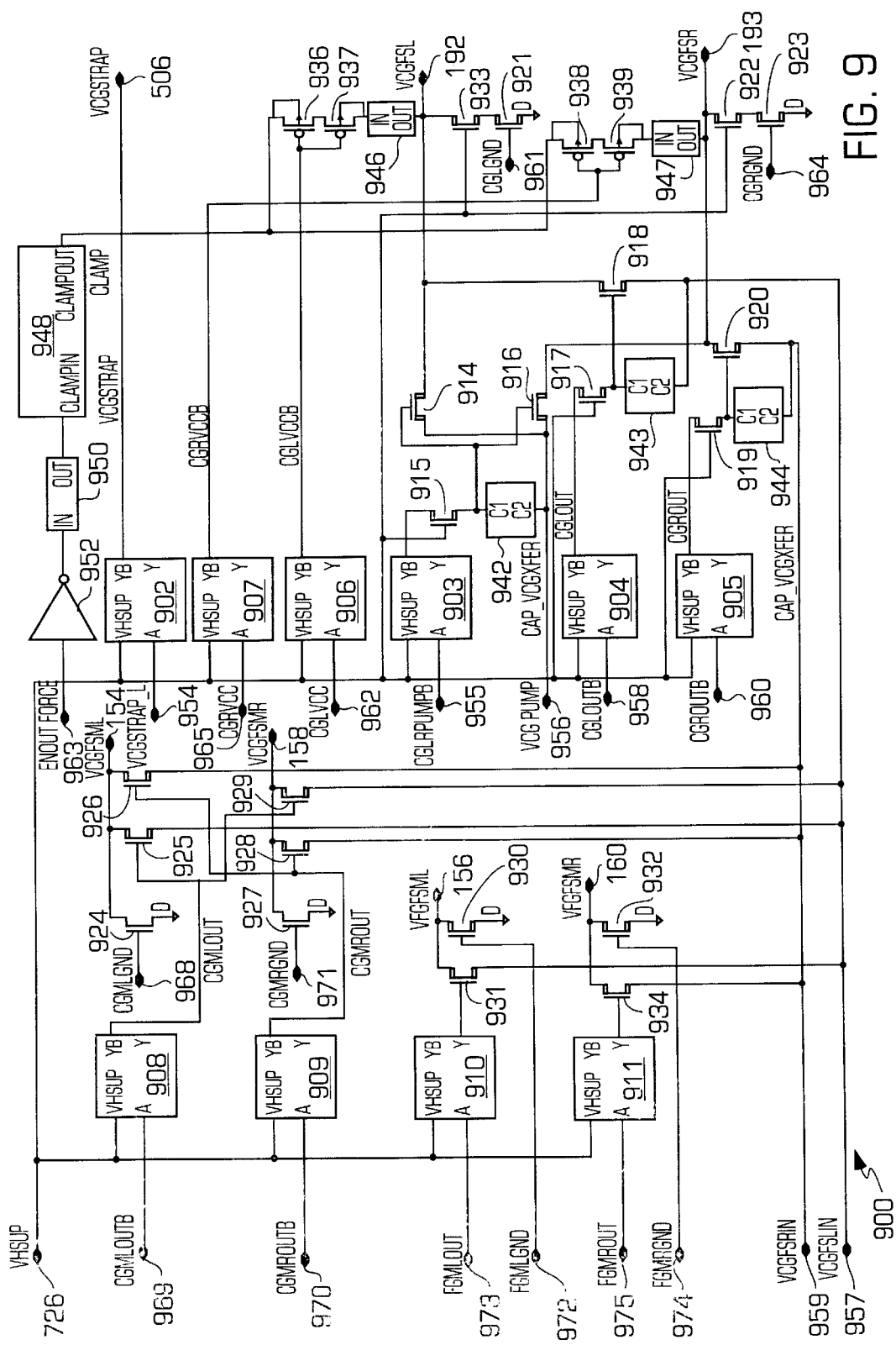
FIG. 9 is a schematic diagram of a control circuit for a fuse control gate according to the present invention.

FIG. 9 is a schematic diagram of a control circuit 900 for the fuse control gate according to the present invention.

The control circuit 900 comprises a plurality of voltage shift stages 902 through 911, a plurality of NMOS transistors 914 through 934, a plurality of PMOS transistors 936, 937, 938, 939, a plurality of capacitors 942, 943, 944, a plurality of resistors 946, 947, a clamp 948, a RC filter 950, and an inverter 952.

The voltage shift stage 903, the NMOS transistors 914 and 915 and the capacitor 942 are coupled together in a HV transceiver scheme similar to that described above in conjunction above with FIG. 7 for the control gate fuse voltage (VCGFSL) 192. A control gate pump (CGLRPUMPB) signal 955 is applied to the input terminal of the voltage shift stage 903. A control gate pump (VCG PUMP) voltage 956 is applied to the NMOS transistors 914 and 916.

The voltage shift stage 903, the NMOS transistors 915 and 916 and the capacitor 942 are coupled together in a HV transceiver scheme similar to that described above in conjunction above with FIG. 7 for the control gate fuse voltage (VCGFSR) 193.

The voltage shift stage 904, the NMOS transistors 917, 918 and the capacitor 943 are coupled together in a HV transceiver scheme to couple a control gate fuse input voltage (VCGFSLIN) 957 to the control gate fuse voltage (VCGFSL) 192. A control gate output (CGLOUTB) signal 958 is applied to the input terminal of the voltage shift stage 904.

The voltage shift stage 905, the NMOS transistors 919, 920 and the capacitor 944 are coupled together in a HV transceiver scheme to couple a control gate fuse input voltage (VCGFSRIN) 959 to the control gate fuse voltage (VCGFSR) 193. A control gate output (CGROUTB) signal 960 is applied to the input terminal of the voltage shift circuit 905.

A limited current HV transceiver scheme transmits the HV into the control gate fuse voltage (VCGFSL) 192 and the control gate fuse voltage (VCGFSR) 193. A limited current HV transceiver comprises the PMOS transistors 936 and 937, the resister 946, the voltage shift stage 906, and the NMOS transistors 933 and 921.

The NMOS transistors 933 and 921 deselect the control gate fuse voltage (VCGFSL) 192. The voltage shift stage 906 outputs a high voltage, e.g. 10V, at the gate of the PMOS transistors 936 and 937 to deselect the control gate fuse voltage (VCGFSL) 192. However with a high voltage, e.g. 10V, on the gate and source of the PMOS transistor 936, and forcing a high voltage, e.g. 11 V, onto the control gate fuse voltage (VCGFSL) 192, a current limited by the resistor 946 flows into the PMOS transistors 936 and 937. The PMOS transistors 936 and 937 are series connected with wells split as shown to avoid forwarding the wells. A control gate ground (CGLGND) 961 is applied to the gate of the NMOS transistor 921. A control gate voltage (CGLVCC) 962 is applied to the input terminal of the voltage shift stage 906. A force output enable signal (ENUT FORCE) 963 is applied to the input of the inverter 952, which generates an inverted signal that is filtered by the RC filter 950 and clamped by the clamp 948. The inverted signal is applied to the bulk and sources of the PMOS transistors 936 and 938.

Another limited current HV transceiver comprises the PMOS transistors 938 and 939, the resistor 947, the voltage shift stage 907 and the NMOS transistors 922 and 923, which are arranged in a manner similar to the above-described limited current HV transceiver scheme. The NMOS transistors 922 and 923 deselect the control gate fuse voltage (VCGFSR) 193. A control gate ground (CGRND) 964 is applied to the gate of the NMOS transistor 923. A control gate voltage (CGRVCC) 965 is applied to an input of the voltage shift stage 907.

Another HV transceiver scheme generates the first fuse control gate margin control (VCGFSML) signal 154 and the second fuse control gate margin control (VCGFSMR) signal 158. The drain-source terminals of the NMOS transistor 924 ground the first fuse control gate margin control signal 154 in response to a control gate margin ground signal (CGMLGND) 968 applied to a gate thereof. The drain-source terminals of the NMOS transistor 925 couple the control gate fuse input voltage (VCGFSLIN) 957 to the first fuse control gate margin control (VCGFSML) signal 154 in response to an output from the voltage shift stage 908 applied to the gate thereof. A control gate output (CGMLOUTB) 969 is applied to the input terminal of the voltage shift stage 908. The drain-source terminals of the NMOS transistor 926 couple the control gate fuse input voltage (VCGFSRIN) 959 to the first fuse control gate margin control (VCGFSNL) signal 154 in response to the output from the voltage shift stage 909. A control gate margin output signal (CGMROUTB) 970 is applied to an input terminal of the voltage shift stage 909.

The drain-source terminals of the NMOS transistor 927 ground the second fuse control gate margin control signal 158 in response to a control gate margin ground signal (CGMRGND) 971 applied to a gate thereof. The drain-source terminals of the NMOS transistor 928 couple the control gate fuse input voltage (VCGFSRIN) 959 to the second fuse control gate margin control (VCGFSMR) signal 158 in response to an output from the voltage shift stage 909 applied to the gate thereof. The drain-source terminals of the NMOS transistor 929 couple the control gate fuse input voltage (VCGFSLIN) 957 to the second fuse control gate margin control (VCGFSMR) signal 158 in response to the output from the voltage shift stage 908.

Another HV transceiver scheme generates the first fuse floating gate margin control (VFGFSNL) signal 156 and the second fuse floating gate margin control (VFGFSMR) signal 160. The drain-source terminals of the NMOS transistor 930 ground the first fuse floating gate margin control signal 156 in response to a floating gate margin ground signal (FGMLGND) 972 applied to a gate thereof. The drain-source terminals of the NMOS transistor 931 couple the control gate fuse input voltage (VCGFSLIN) 957 to the first fuse floating gate margin control (VFGFSML) signal 156 in response to an output from the voltage shift stage 910 applied to the gate thereof. A floating gate margin output (FGMLOUT) 973 is applied to the input terminal of the voltage shift stage 910.

The drain-source terminals of the NMOS transistor 932 ground the second fuse floating gate margin control signal 160 in response to a floating gate margin ground signal (FGMRGND) 974 applied to a gate thereof. The drain-source terminals of the NMOS transistor 934 couple the control gate fuse input voltage (VCGFSRIN) 959 to the second fuse floating gate margin control (VFGFSMR) signal 160 in response to an output from the voltage shift stage 911 applied to the gate thereof. A floating gate margin output (FGMROUT) 975 is applied to the input terminal of the voltage shift stage 911.

The inverted output terminal 722 of the voltage shift stage 902 generates the strap control gate voltage (VCGSTRAP) signal 506 in response to the high voltage supply voltage (VHSUP) 726 and a second strap control gate voltage (VCGSTRAP_L) signal 954.

The fuse may be operated in various states or functions as shown in Tables I, II, and III. In one embodiment, the contents of the memory cells 112 are forced to a level by applying the control signals to the fuse as indicated in the FORCEFUSE column of Table I. In one embodiment, the fuse is programmed by applying the control signals to the fuse as indicated in the PROGFUSE column of Table I. In one embodiment, the fuse is read by applying the control signals to the fuse as indicated in the READFUSE column of Table I. In one embodiment, the fuse is erased by applying the control signals to the fuse as indicated in the ERASEFUSE column of Table I.

In one embodiment, the sense margin of the first memory cell 112-1 or the second memory cell 112-2 is determined by applying the control signals as indicated in the SENSMARFSL or the SENMARFSR columns, respectively, of Table II. In one embodiment, the operation of the fuse during a power-on reset (POR) is set by applying the control signals as indicated in the POR column of Table II. In one embodiment, the normal states of the fuse are set by applying the control signals of the NORM column of Table II. The NORM state is the default operating state of the fuse cell element 100 and the memory device.

The fuse herein also has means for stressing and screening the fuse elements such as the memory cells.

Figure 10:
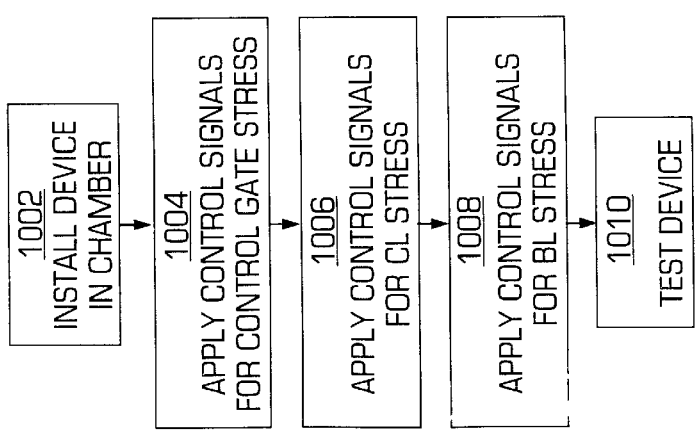
FIG. 10 is a flowchart of an operation of screening the fuse cell elements of FIG. 1 according to the present invention.

FIG. 10 is a flowchart of an operation of screening the fuse elements 112. The fuse elements may be stressed and screened, for example, to eliminate defective or weak devices during manufacturing. The memory device is installed into a stress chamber (step 1002). The stress chamber includes interconnections to external electrical equipment for applying appropriate signals to the memory device. The stress chamber may also provide temperature, shock, or other environments. Each input/output port of the fuse element 112 may be tested. The control signals applied to the memory device are set based on the input/output port being tested. The control gate is stressed by applying the control signals as indicated in the CG stress column of Table III (step 1004). The column line (CL) is stressed by applying the control signals as indicated in the CL stress column of Table III (step 1006). The bit line (BL) is stressed by applying the control signals as indicated in the BL stress column of Table III (step 1008). After stressing, the device may be tested for compliance with predetermined acceptance requirements (step 1010).

Figure 11:
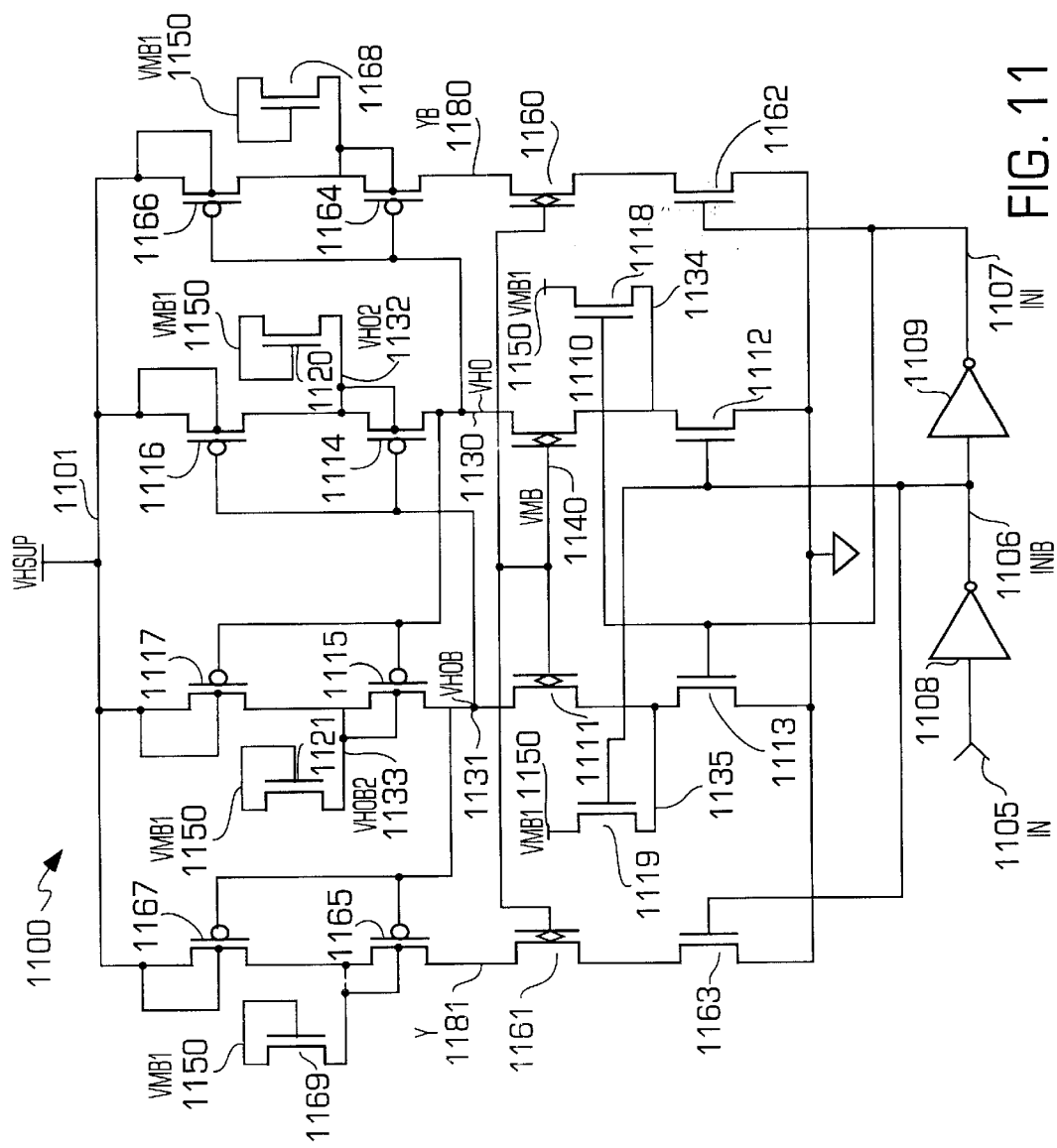
FIG. 11 is a schematic diagram of a voltage shift stage of the control circuits of FIGS. 7 and 9 according to the present invention.

FIG. 11 is a schematic diagram of the voltage shift stage 702, 704 and 902–911. The voltage shift stage comprises a plurality of inverters 1108, 1109, a plurality of NMOS transistors 1110–1113, 1118–1121, 1160–1163, 1168–1169, and a plurality of PMOS transistors 1114–1117, 1164–1167. The transistors 1110–1121 form a cross coupled stage. The transistors 1160–1169 form an output buffer stage. The series connected inverters 1108–1109 provide the input control signals. The NMOS transistors 1110, 1111, 1160, 1161 are NATIVE high voltage (HV) transistors. The PMOS transistors 1114–1117, 1164–1167 are HV PMOS transistors. The NMOS transistors 1120–1121, 1168–1169 are HV NMOS transistors. The NMOS transistors 1112,1113,1118, 1119,1162,1163 are HV NMOS transistors. Alternatively NMOS transistors 1112,1113,1118, 1119,1162,1163 are low voltage (LV) NMOS transistors due to the high voltage being buffered by the transistors 1110, 1111, 1160, and 1161.

A high voltage supply (VHSUP) 1101 has a voltage value typically higher than the power supply voltage. A VMB node 1140 receives a medium bias voltage, e.g. VCC. A VMB1 node 1150 receives another medium bias voltage, e.g. VCC.

In the cross coupled stage, the PMOS pull up is divided into two series PMOS 1114 and 1116 to reduce high voltage stress. The drain-source terminals of the PMOS transistors 1114 and 1116 are coupled together in series between the high voltage (VHSUP) 1101 and a high voltage output (VHO) node 1130. The gates of the PMOS transistors 1114 and 1116 are coupled together and to a complementary high voltage output (VHOB) node 1131. The PMOS transistor 1114 has its well connected to a common node formed of the drain of the PMOS transistor 1116, a second high voltage (VHO2) node 1132 and the source of the diode connected NMOS transistor 1120, which has its drain coupled to the VMB1 node 1150. The PMOS transistors 1115 and 1117, and the NMOS transistor 1121 are similarly coupled together, replacing the VHO2 node 1132 with a VHOB2 node 1133, and the VHOB node 1131 being interchanged with the VHO node 1130. Each PMOS transistor 1114, 1115, 1164, 1165 has its own well. The drain-source terminals of the NMOS transistors 1110, 1112 are coupled together in series between the VHO node 1130 and ground. The drain-source terminals of the NMOS transistors 1111, 1113 are coupled between the VHOB node 1131 and ground. The gates of the NMOS transistors 1110 and 1111 are coupled together and to the VMB node 1140. The drain-source terminals of the NMOS transistors 1118 and 1119 are coupled between the sources of the respective NMOS transistors 1110 and 1111, which form respective nodes 1134 and 1135, and the VMB1 node 1150. The gates of the NMOS transistors 1118 and 1113 are coupled to the output of the inverter 1109 to receive a INI signal 1107. The gates of the NMOS transistor 1112 and 1119 are coupled together and to the output of the inverter 1108 to receive an INIB signal 1106, which is an inversion of a IN signal 1105 applied to the inverter 1108. As the gates of the PMOS transistors 1114 and 1116 transitions from low to high, the voltage at the VHO2 node 1132 goes from the high voltage VHSUP 1101 to a low minimum voltage (VMB1–VTNH), hence the junction break down of the PMOS transistors 1114, 1116 has been improved by at least (VMB1–VTNH).

In the cross coupled stage, the transistors 1118–1119 provide a fast early pull up at the nodes 1134–1135, and hence the nodes 1130–1131 reduce the crow bar current when switching by reducing quickly the VGS (gate-source voltage) of the PMOS transistors 1115, 1117 and 1114, 1116. The position of the NMOS transistors 1118, 1119 is strategically placed at the nodes 1134, 1135 to eliminate the break down of the circuits. In another embodiment, the control signals applied to the gates of the transistors 1112, 1113, 1118, 1119, 1162, 1163 are appropriately non-overlapped or overlapped to avoid further the crow bar switching current.

Alternatively the early pull up (at the source of the transistors 1160, 1161) may be implemented at the output stage to decrease the pull up time.

In the output stage, the PMOS transistors 1166 and 1164 and the NMOS transistors 1160, 1162, and 1168 are coupled together in a manner similar to the PMOS transistors 1117, 1115 and the NMOS transistors 1111, 1113, and 1121, but with replacing the VHOB node 1131 with an output YB node 1180. Likewise, the PMOS transistors 1167 and 1165 and the NMOS transistors 1161, 1163, and 1169 are coupled together in a manner similar to the PMOS transistors 1116, 1114 and the NMOS transistors 1110, 1112, and 1120, but with replacing the VHO node 1130 with an output Y node 1181. The NMOS transistors 1168 and 1169 on the output buffer stage functions similar to the NMOS transistors 1120, 1121.

The voltage shift stage functions as follows. For a high value of the IN signal 1105, a the INIB signal 1106 is low, and the INI signal 1107 is high. A low value of the INIB signal 1106 turns off the NMOS transistors 1112, 1119 and 1163. A high value of the INI 1107 signal turns on the NMOS transistors 1113, 1118 and 1162. The NMOS transistor 1113 being on causes the nodes 1135, 1131 to be low. The NMOS transistor 1162 being on causes the node 1180 to be low. The node 1131 being low turns on PMOS transistors 1165, 1167 that pulls up the node Y 1181 to the high voltage VHSUP 1101. For a low value of the IN signal 1105, the described on and off states of the voltage shift stage are reversed.

Various other well-known circuits, such as logic control circuits and bias circuits are not described herein.

In this disclosure, there is shown and described only the preferred embodiments of the invention, but, as aforementioned, it is to be understood that the invention is capable of use in various other combinations and environments and is capable of changes or modifications within the scope of the inventive concept as expressed herein.

TABLE I

|  | FORCEFUSE TESTMODE #77 DINB 1/0 | PROGFUSE TESTMODE #76 DIN 1/0 | READFUSE TESTMODE #75 | ERASEFUSE TESTMODE #74 |
|---|---|---|---|---|
| BLFSL 170 | = DINB | BIAS/INH | FLOAT | FLOAT |
| BLFSR 177 | = DIN | INH/BIAS | FLOAT | FLOAT |
| CGFSL 192 | 0 | VCGPUMP | GND | VCGPUMP |
| CGFSR 193 | 0 | VCGPUMP | GND | VCGPUMP |
| VCLFS 163 | (BIAS) | VCLPUMP | GND | GND |
| VBFS 174 | VDD | BIAS | (BIAS) | (BIAS) |
| VCLFS 163 | (GND) | VCLPUMP | (GND) | VCLPUMP |
| VRBIAS 164 | BIAS | HV | VCC | HV |
| BLEN 176 | HV | HV | GND | GND |
| READDLY 136 | VDD | GND | GND | GND |
| ENOUT 182 | PULSE LO | VDD | VDD | VDD |
| POR | PULSE | GND | GND | GND |
| VCGMFSL 154 | (GND) | VDD | (GND) | VDD |
| VCGMFSR 158 | (GND) | VDD | (GND) | VDD |
| VFGMFSL 156 | GND | GND | GND | GND |
| VFGMFSR 160 | GND | GND | GND | GND |

TABLE II

|  | SENSMARFSL TESTMODE #79 AND #81 | SENSMARFSR TESTMODE #80 AND #81 | POR | NORM |
|---|---|---|---|---|
| BLFSL 170 | SENSED | SENSED | SENSE | Z |
| BLFSR 177 | SENSED | SENSED | SENSE | Z |
| CGFSL 192 | INPUT PAD_ALE= VMARGIN | INPUT PAD_ALE= VMARGIN2 | VDD | GND |
| CGFSR 193 | INPUT PAD_CLE= VMARGIN2 | INPUT PAD_CLE= VMARGIN | VDD | GND |
| VCLFS 163 | BIAS | BIAS | BIAS | GND |
| VBFS 174 | (BIAS) | (BIAS) | GND | GND |
| VCLFS 163 | GND | GND | GND | GND |
| VRBIAS 164 | BIAS | BIAS | BIAS | VCC |
| BLEN 176 | GND | GND | GND | GND |
| READDLY 136 | GND | GND | VDD | GND |
| ENOUT 182 | PULSE LO | PULSE LO | PULSE LO | VDD |
| POR | PULSE | PULSE | PULSE | GND |
| VCGMFSL 154 | INPUT PAD_ALE= VMARGIN | INPUT PAD_CLE= VMARGIN | GND | GND |
| VCGMFSR 158 | INPUT PAD_ALE= VMARGIN | INPUT PAD_CLE= VMARGIN | GND | GND |
| VFGMFSL 156 | GND | INPUT PAD_ALE= VMARGIN2 | GND | GND |
| VFGMFSR 160 | INPUT PAD_CLE= VMARGIN2 | GND | GND | GND |

TABLE III

|  | CG STRESS (ERASE) INCG = SV | CL STRESS (PROGFUSE, INCGFSLR, INCLFS) CL = SV | BL STRESS (PROGFUSE, INCGFSLR, INCLFS) CG = GND, CL = FLOAT |
|---|---|---|---|
| BLFSL 170 | FLOAT | VCC/GND | INH/BIAS (DATA = 0 FOR STRESS) |
| BLFSR 177 | FLOAT | VCC/GND | INH/BIAS (DATA = 1 FOR STRESS) |
| CGFSL 192 | INPUT PAD_ALE = SV | INPUT PAD_ALE = 0 | INPUT PAD_ALE = 0 |
| CGFSR 193 | INPUT PAD_CLE = SV | INPUT PAD_CLE = 0 | INPUT PAD_CLE = 0 |
| VCLFS 163 | GND | INPUT PAD_WPB = SV | INPUT PAD_WPB = Z |
| VBFS 174 | (BIAS) | GND | BIAS |
| VCLFS 163 | GND | GND | INPUT PAD_WPB = Z |
| VRBIAS 164 | HV | VCC | RV |
| BLEN 176 | GND | GND | HV |
| READDLY 136 | GND | GND | GND |
| ENOUT 182 | VDD | VDD | VDD |
| POR | GND | GND | GND |
| VCGMFSL 154 | VDD | GND | VDD |
| VCGMFSR 158 | VDD | GND | VDD |
| VFGMFSL 156 | GND | GND | GND |
| VFGMFSR 160 | GND | GND | GND |

What is claimed is:

1. A memory device comprising:
first and second fuse elements;
a latch coupled to the first and second fuse elements for storing the contents of the first and second fuse elements; and
first and second margining circuits coupled in parallel to the first and second fuse elements, respectively.

2. The memory device of claim 1 wherein the first and second margining circuits each comprise first and second transistors of a first type, the first transistor of the first type including a first terminal coupled to a first terminal of the corresponding fuse element, including a second terminal spaced apart from the first terminal with a channel therebetween, and a gate for controlling the flow of current in said channel, the second transistor of the first type including a first terminal coupled to the second terminal of the first transistor of the first type, including a second terminal coupled to a second terminal of the fuse element and spaced apart from the first terminal with a channel therebetween, and a gate for controlling the flow of current in said channel.

3. The memory device of claim 2 wherein the first and second fuse elements each comprise a split gate memory having a control gate and a floating gate.

4. The memory device of claim 3 wherein one of the first and second transistors of the first type has electrical characteristics similar to the control gate and the other one of the first and second transistors of the first type has electrical characteristics similar to the floating gate.

5. The memory device of claim 3 further comprising a filter coupled to the gate of each split gate memory cell.

6. The memory device of claim 5 wherein the filter is a resistor-capacitor network filter.

7. The memory device of claim 3 further comprising a clamp coupled to a control gate of the split gate memory cell.

8. The memory device of claim 2 further comprising an equalization network including first and second transistors of a second type, the first transistor of the second type including a first terminal coupled to a control gate of the first fuse element, including a second terminal spaced apart from said first terminal with a channel therebetween, and including a gate coupled to a control signal terminal for controlling the flow of current in said channel, the second transistor of the second type including a first terminal coupled to the second terminal of the first transistor of the second type, including a second terminal coupled to a control gate of the second fuse element and spaced apart from said first terminal with a channel therebetween, and including a gate coupled to the gate of the first transistor of the second type for controlling current in said channel.

9. The memory device of claim 1 wherein the first and second margining circuits comprise a transistor of a first type including a first terminal coupled to a power terminal, including a second terminal spaced apart from said first terminal with a channel therebetween coupled to a control gate terminal of the fuse element, and including a gate for controlling current in said channel.

10. The memory device of claim 1 wherein the first and second fuse elements are cross-coupled.

11. The memory device of claim 1 further comprising an equalization network coupled between the first and second fuse elements to equalize a control voltage applied to the first and second fuse elements.

12. The memory device of claim 1 further comprising a filter coupled to each fuse element.

13. The memory device of claim 1 further comprising a clamp coupled to a control signal input of the fuse element.

14. The memory device of claim 1 further comprising a forcing circuit forcing the fuse to a particular state.

15. The memory devices of claim 1 wherein a signal applied to the memory cells is set at a voltage to stress the memory cells.

16. The memory device of claim 1 further comprising a current source coupled to an input of one of the first and second fuse elements, and wherein a variable control gate voltage is applied to the other of the first and second fuse elements to test margin of said other fuse element.

17. The memory device of claim 1 further comprising a voltage shift circuit providing a voltage signal selectively having a high voltage signal or a low voltage signal in response to an input signal having a voltage that is at a supply voltage or the low voltage and coupled to the first and second margining circuit for applying the voltage signal to the first or second fuse elements.

18. The memory device of claim 17 wherein the voltage shift circuit comprises a cross coupled stage and an output stage,
  the cross coupled stage comprising first, second, third and fourth PMOS transistors, the first PMOS transistor including a first terminal coupled to a high voltage terminal, including a second terminal coupled to a first bias terminal and spaced apart from said first terminal with a channel therebetween, including a gate for controlling current in said channel, and including a well, the second PMOS transistor including a first terminal coupled to the second terminal of the first PMOS transistor, including a second terminal spaced apart from said first terminal with a channel therebetween, including a gate coupled to the gate of the first PMOS transistor for controlling current in said channel, and including a well coupled to the first bias terminal, the third PMOS transistor including a first terminal coupled to the high voltage terminal, including a second terminal coupled to a second bias terminal and spaced apart from said first terminal with a channel therebetween, including a gate coupled to the second terminal of the second PMOS transistor for controlling current in said channel, and including a well, the fourth PMOS transistor including a first terminal coupled to the second terminal of the third PMOS transistor, including a second terminal coupled to a node formed of the gates of the first and second PMOS transistors, including a gate coupled to the gate of the third PMOS transistor, including a well coupled to the second bias terminal,
  the output stage comprising fifth, sixth, seventh and eighth PMOS transistors, the fifth PMOS transistor including a first terminal coupled to the high voltage terminal, including a second terminal coupled to a third bias terminal and spaced apart from said first terminal with a channel therebetween, including a gate coupled to the second terminal of the second PMOS transistor for controlling current in said channel, and including a well, the sixth PMOS transistor including a first terminal coupled to the second terminal of the fifth PMOS transistor, including a second terminal coupled to a first output terminal and spaced apart from said first terminal with a channel therebetween, including a gate coupled to the gate of the fifth PMOS transistor for controlling current in said channel, and including a well coupled to the third bias terminal, the seventh PMOS transistor including a first terminal coupled to the high voltage terminal, including a second terminal coupled to a fourth bias terminal and spaced apart from said first terminal with a channel therebetween, including a gate coupled to the second terminal of the fourth PMOS transistor for controlling current in said channel, and including a well, the eighth PMOS transistor including a first terminal coupled to the second terminal of the seventh PMOS transistor, including a second terminal coupled to a second output terminal and spaced apart from said first terminal with a channel therebetween, including a gate coupled to the gate of the seventh PMOS transistor for controlling current in said channel, and including a well coupled to the fourth bias terminal, the wells of the second, fourth, sixth, and eighth PMOS transistors being separate from each other, the wells of the first, third, fifth, and seventh PMOS transistors being coupled to the high voltage terminal.

19. The memory device of claim 18, wherein the cross coupled stage further comprises a first NMOS transistor including a first terminal coupled to a first medium voltage terminal, including a second terminal coupled to the first bias terminal and spaced apart from said first terminal with the channel therebetween, and including a gate coupled to the said first terminal for controlling current in said channel, and further comprises a second NMOS transistor including a first terminal coupled to the first medium voltage terminal, including a second terminal coupled to the second bias terminal and spaced apart from said first terminal with the channel therebetween, and including a gate coupled to said first terminal for controlling current in said channel, and
  the output stage further comprises a third NMOS transistor including a first terminal coupled to the first medium voltage terminal, including a second terminal coupled to the third bias terminal and spaced apart from said first terminal with a channel therebetween, and including a gate coupled to said first terminal for controlling current in said channel, and further comprises a fourth NMOS transistor inclining a first terminal coupled to the first medium voltage terminal, including a second terminal coupled to the fourth bias terminal and spaced apart from said first terminal with a channel therebetween, and including a gate coupled to the said first terminal for controlling current in said channel.

20. The memory device of claim 19 wherein the cross coupled stage further comprises fifth, sixth, seventh, eighth, ninth, and tenth NMOS transistors, the fifth NMOS transistor including a first terminal coupled to the second terminal of the second PMOS transistor, including a second terminal coupled to a fifth bias terminal and spaced apart from said first terminal with a channel therebetween, and including a gate coupled to a second medium bias voltage terminal for controlling current in said channel, the sixth NMOS transistor including a first terminal coupled to the second terminal of the fifth NMOS transistor, including a second terminal coupled to a ground terminal and spaced apart from said first terminal with a channel therebetween, and including a gate coupled to a first control signal for controlling current in said channel, the seventh NMOS transistor including a first terminal coupled to the first medium voltage terminal, including a second terminal coupled to the fifth bias terminal and spaced apart from said first terminal with a channel therebetween, and including a gate coupled to a second control signal for controlling current in said channel, the second control signal being complementary of the first control signal, the eighth NMOS transistor including a first terminal coupled to the second terminal of the fourth PMOS transistor, including a second terminal coupled to a sixth bias terminal and spaced apart from said first terminal with a channel therebetween, and including a gate coupled to the second medium bias voltage terminal for controlling current in said channel, the ninth NMOS transistor including a first terminal coupled to the second terminal of the eighth NMOS transistor, including a second terminal coupled to the ground terminal and spaced apart from said first terminal with a channel therebetween, and including a gate coupled to the second control signal for controlling current in said channel, the tenth NMOS transistor including a first terminal coupled to the first medium voltage terminal, including a second terminal coupled to the sixth bias voltage terminal and spaced apart from said first terminal with a channel therebetween, and including a gate coupled to the first control signal for controlling current in said channel,
  the output stage further comprising eleventh, twelfth, thirteenth, and fourteenth NMOS transistors, the eleventh NMOS transistor including a first terminal coupled to the first output terminal, including a second terminal spaced apart from said first terminal with a channel therebetween, and including a gate coupled to the second medium bias voltage terminal for controlling current in said channel, the twelfth NMOS transistor including a first terminal coupled to the second terminal of the eleventh NMOS transistor, including a second terminal coupled to the ground terminal and spaced apart from said first terminal with a channel therebetween, and including a gate coupled to the second control signal for controlling current in said channel, the thirteenth NMOS transistor including a first terminal coupled to the second output terminal, including a second terminal spaced apart from said first terminal with a channel therebetween, and including a gate coupled to the second medium bias voltage terminal for controlling current in said channel, the fourteenth NMOS transistor including a first terminal coupled to the second terminal of the thirteenth NMOS transistor, including a second terminal coupled to the ground terminal and spaced apart from said first terminal with a channel therebetween, and including a gate coupled to the first control signal for controlling current in said channel.

21. The memory device of claim 20 wherein the first and second control signals are non-overlapping.

22. The memory device of claim 20 wherein a signal applied to the memory cells is set at a voltage to stress the memory cells.

23. The memory device of claim 1 further comprising a bootstrap high voltage transceiver coupled to the first and second margining circuits to provide a voltage signal selectively having a high voltage signal or a low voltage signal in response to an input signal having a voltage that is at a supply voltage or the low voltage.

24. The memory device of claim 1 further comprising a limited current high voltage transceiver coupled to the first and second margining circuits to provide a voltage signal selectively having a high voltage signal or a low voltage signal in response to an input signal having a voltage that is at a supply voltage or the low voltage.

25. A memory device comprising:
  first and second fuse elements, each fuse element having a common line terminal, a control gate terminal, and a bit line terminal;
  an isolation circuit including:
    a first transistor of a first type including a first terminal, a second terminal spaced apart from said first terminal with a channel therebetween and coupled to the bit line terminal of the first fuse element, and including a gate for controlling current in said channel in response to an enable signal;
    a second transistor of the first type including a first terminal, a second terminal spaced apart from said first terminal with a channel therebetween and coupled to the bit line terminal of the second fuse element, and including a gate for controlling current in said channel in response to said enable signal;
  a latch including:
    a first transistor of a second type including a first terminal coupled to a power terminal, including a second terminal spaced apart from said first terminal with a channel therebetween and coupled to the first terminal of the first transistor of the first type, and having a gate for controlling current in said channel,
    a third transistor of the first type including a first terminal coupled to the second terminal of the first transistor of the second type, including a second terminal spaced apart from said first terminal with a channel therebetween, and including a gate for controlling current in said channel and coupled to the first terminal of the second transistor of the first type,
    a second transistor of the second type including a first terminal coupled to the power terminal, including a second terminal spaced apart from said first terminal with a channel therebetween and coupled to the common node formed of the first terminal of the second transistor of the first type and the gates of the first transistor of the second type and the third transistor of the first type, and including a gate for controlling current in said channel and coupled to the common node of the second terminal of the first transistor of the second type and the first terminal of the third transistor of the first type;
    a fourth transistor of the first type including a first terminal coupled to the second terminal of the second transistor of the second type, including a second terminal spaced apart from said first terminal with a channel therebetween and coupled to the second terminal of the third transistor of the first type, and including a gate for controlling current in said channel and coupled to the gate of the second transistor of the second type; and
    a fifth transistor of the first type including a first terminal coupled to the common node formed of the second terminals of the third and fourth transistors of the first type, including a second terminal spaced apart from said first terminal with a channel therebetween and coupled to a ground terminal, and including a gate for controlling current in said channel in response to a latch signal applied thereto.

26. The memory device of claim 25 further comprising first and second margining circuits coupled in parallel to the first and second fuse elements, respectively.

27. The memory device of claim 26, wherein the first margining circuit comprises:
  a sixth transistor of the first type including a first terminal, including a second terminal spaced apart from said first terminal with a channel therebetween and coupled to the common line terminal of the first fuse element, and including a gate for controlling current in said channel, and
  a seventh transistor of the first type including a first terminal coupled to the bit line terminal of the first fuse element, including a second terminal spaced apart from said first terminal with a channel therebetween and coupled to the first terminal of the sixth transistor of the first type, and including a gate for controlling current in said channel; and
  the second margining circuit comprises:
    an eighth transistor of the first type including a first terminal, including a second terminal spaced apart from said first terminal with a channel therebetween and coupled to the common line terminal of the second fuse element, and including a gate for controlling current in said channel, and
    a ninth transistor of the first type including a first terminal coupled to the bit line terminal of the second fuse circuit, including a second terminal spaced apart from said first terminal with a channel therebetween and coupled to the first terminal of the eighth transistor of the first type, and including a gate for controlling current in said channel; and
  the memory device further comprises a tenth transistor of the first type including a first terminal coupled to a common node formed of the second terminals of the sixth and eighth transistors of the first type, including a second terminal spaced apart from the first terminal with a channel therebetween and coupled to a fuse common line signal, and including a gate for controlling current in said channel.

28. The memory device of claim 25 further comprising a precharge circuit for precharging the second terminals and the gates of the first and second transistors of the second type and the first terminals and the gates of the third and fourth transistors of the first type.

29. The memory device of claim 28 wherein the precharge circuit comprises:
   a third transistor of the second type including a first terminal coupled to the gate of the first transistor of the first type, including a second terminal spaced apart from said first terminal with a channel therebetween and coupled to the gate of the second transistor of the second type, and including a gate for controlling current in said channel in response to a precharge signal; and
   a sixth transistor of the first type including a first terminal coupled to the gate of the first transistor of the second type, including a second terminal spaced apart from said first terminal with a channel therebetween and coupled to the gate of the second transistor of the second type, and including a gate for controlling current in said channel in response to an inverted precharge signal.

30. The memory device of claim 25 further comprising a programming inhibit circuit coupled to the bit line terminals of the first and second fuse elements to program the first and second fuse elements.

31. The memory device of claim 30 wherein the programming inhibit circuit comprises:
   a sixth transistor of the first type including a first terminal coupled to the bit line terminal of the first fuse element, including a second terminal spaced apart from said first terminal with a channel therebetween, and including a gate for controlling current in said channel in response to an enable signal applied thereto;
   a third transistor of the second type including a first terminal coupled to the power terminal, including a second terminal spaced apart from said first terminal with a channel therebetween and coupled to the second terminal of the sixth transistor of the first type, and including a gate for controlling current in said channel in response to a first bit line signal applied thereto;
   a seventh transistor of the first type including a first terminal coupled to the second terminal of the third transistor of the second type, including a second terminal spaced apart from said first terminal with a channel therebetween, and including a gate for controlling current in said channel and coupled to the gate of the third transistor of the second type;
   an eighth transistor of the first type including a first terminal coupled to the second terminal of the seventh transistor of the first type, including a second terminal spaced apart from said first terminal with a channel therebetween and coupled to ground, and including a gate for controlling current in said channel;
   a ninth transistor of the first type including a first terminal coupled to the bit line terminal of the second fuse element, including a second terminal spaced apart from said first terminal with a channel therebetween, and including a gate for controlling current in said channel in response to the enable signal;
   a fourth transistor of the second type including a first terminal coupled to the power terminal, including a second terminal spaced apart from said first terminal with a channel therebetween and coupled to the second terminal of the ninth transistor of the first type, and including a gate for controlling current in said channel in response to a second bit line signal applied thereto, the second bit line signal being an inversion of the first bit line signal; and
   a tenth transistor of the first type including a first terminal coupled to the second terminal of the ninth transistor of the first type, including a second terminal spaced apart from said first terminal with a channel therebetween and coupled to the first terminal of the eighth transistor of the first type, and including a gate for controlling current in said channel and coupled to the gate of the fourth transistor of the second type.

32. The memory device of claim 25 wherein the first and second fuse elements each comprise a split gate memory cell.

33. The memory device of claim 25 further comprising an equalization network coupled between the control gate terminals of the first and second fuse elements to equalize a control gate voltage applied to the first and second fuse elements.

34. The memory device of claim 33 wherein the equalization network comprises:
   a third transistor of the second type including a first terminal coupled to the control gate of the first fuse element, including a second terminal spaced apart from said first terminal with a channel therebetween, and including a gate for controlling current in said channel; and
   a fourth transistor of the second type including a first terminal coupled to the second terminal of the third transistor of the second type, including a second terminal spaced apart from said first terminal with a channel therebetween and coupled to the control gate of the second fuse element, and including a gate for controlling current in said channel and coupled to the gate of the third transistor of the second type.

35. The memory device of claim 25 further comprising a filter coupled to each fuse element.

36. The memory device of claim 35 wherein the filter is a resistor-capacitor network filter.

37. The memory device of claim 25 wherein the first and second fuse elements are split gate memory cells and further comprising a filter coupled to the gate of each split gate memory cell.

38. The memory device of claim 25 further comprising at least one clamp coupled to the control gate terminal of at least one fuse element.

39. The memory device of claim 38 wherein the clamp comprises a plurality of transistors of the first type including a first terminal, a second terminal spaced apart from said first terminal with a channel therebetween, and a gate for controlling current in said channel, the first and second terminals of the plurality of transistors of the first type being coupled together in series between the control gate terminal and ground, the gate and the first terminals of each of the plurality of transistors of the first type being selectively coupled together.

40. The memory device of claim 25 wherein the fuse elements comprise a split gate memory cell and a clamp is coupled to a control gate of the split gate memory cell.

41. A memory device comprising:
   a plurality of memory elements, each memory element comprising:

first and second fuse elements;
a latch coupled to the first and second fuse elements for storing the contents of the first and second fuse elements; and
first and second margining circuits coupled in parallel to the first and second fuse elements, respectively.

42. The memory device of claim 41 wherein the first and second fuse elements each comprise a split gate memory cell and the first and second margining circuits each comprise first and second transistors of a first type, the first transistor of the first type including a first terminal coupled to a first terminal of the fuse element, including a second terminal spaced apart from the first terminal with a channel therebetween, and a gate for controlling the flow of current in said channel, the second transistor of the first type including a first terminal coupled to the second terminal of the first transistor of the first type, including a second terminal coupled to a second terminal of the fuse element and spaced apart from the first terminal with a channel therebetween, and a gate for controlling the flow of current in said channel.

43. The memory device of claim 41 wherein each of the first and second margining circuits of at least one memory element is enabled in succession to set the latch with the contents of the second and first fuse elements, respectively, of the corresponding one of said at least one memory element.

44. The memory device of claim 41 wherein the first margining circuits of all memory elements are enabled to set the latch with the contents of the second fuse element of the corresponding memory element and the second margining circuits of all memory elements is enabled to set the latch with the contents of the first fuse element of the corresponding memory element.

45. The memory device of claim 41 wherein the memory cells have a control gate and the control gate of one of the first and second fuse elements is set to a reference voltage and a reference value of the control gate of the other of the first and second fuse elements is compared by the corresponding latch of the memory cell.

46. The memory device of claim 41 wherein the memory cells have a bit line terminal and the bit line terminal of one of the first and second fuse elements is coupled to a current offset signal and a reference value of the bit line terminal of the other of the first and second fuse elements is compared by the corresponding latch of the memory cell.

47. A memory device comprising:
first and second fuse elements;
a latch coupled to the first and second fuse elements for storing the contents of the first and second fuse elements; and
a filter coupled to each fuse element.

48. The memory device of claim 47 wherein the filter is a resistor-capacitor network filter.

49. The memory device of claim 47 wherein the first and second fuse elements are split gate memory cells, and further comprising a filter coupled to the gate of each split gate memory cell.

50. A memory device comprising:
a plurality of memory elements, each memory element comprising first and second fuse elements and a latch coupled to the first and second fuse elements for storing the contents of the first and second fuse elements; and
at least one filter coupled to the fuse elements of selected ones of the plurality of memory elements.

51. The memory device of claim 50 wherein the filter is a resistor-capacitor network filter.

52. The memory device of claim 50 wherein the first and second fuse elements are split gate memory cells and wherein the filter is coupled to the gate of one of the split gate memory cells.

53. A memory device comprising:
first and second fuse elements;
a latch coupled to the first and second fuse elements for storing the contents of the first and second fuse elements; and
an equalization network coupled between the first and second fuse elements to equalize a control voltage applied to the first and second fuse elements.

54. A memory device comprising:
first and second fuse elements;
a latch coupled to the first and second fuse elements for storing the contents of the first and second fuse elements,
an equalization network coupled between the first and second fuse elements to equalize a control voltage applied to the first and second fuse elements, the equalization network includes first and second transistors of a second type, the first transistor of the second type including a first terminal coupled to a control gate of the first fuse element, including a second terminal spaced apart from said first terminal with a channel therebetween, and including a gate coupled to a control signal terminal for controlling the flow of current in said channel, the second transistor of the second type including a first terminal coupled to the second terminal of the first transistor of the second type, including a second terminal coupled to a control gate of the second fuse element and spaced apart from said first terminal with a channel therebetween, and including a gate coupled to the gate of the first transistor of the second type for controlling current in said channel.

55. A memory device comprising:
a plurality of memory elements, each memory element comprising first and second fuse elements and a latch coupled to the first and second fuse elements for storing the contents of the first and second fuse elements; and
an equalization network coupled between some of the memory elements to equalize a control voltage applied to the first and second fuse elements.

56. A memory device comprising:
a plurality of memory elements, each memory element comprising first and second fuse elements and a latch coupled to the first and second fuse elements for storing the contents of the first and second fuse elements; and
an equalization network coupled between some of the memory elements to equalize a control voltage applied to the first and second fuse elements, the equalization network including first and second transistors of a second type, the first transistor of the second type including a first terminal coupled to a control gate of the first fuse element, including a second terminal spaced apart from said first terminal with a channel therebetween, and including a gate coupled to a control signal terminal for controlling the flow of current in said channel, the second transistor of the second type including a first terminal coupled to the second terminal of the first transistor of the second type, including a second terminal coupled to a control gate of the second fuse element and spaced apart from said first terminal with a channel therebetween, and including a gate coupled to the gate of the first transistor of the second type for controlling current in said channel.

57. A memory device comprising:
first and second fuse elements;
a latch coupled to the first and second fuse elements for storing the contents of the first and second fuse elements; and
at least one clamp coupled to a control signal terminal of at least one fuse element.

58. The memory device of claim 57 wherein the clamp comprises a plurality of transistors of the first type including a first terminal, a second terminal spaced apart from said first terminal with a channel therebetween, and a gate for controlling current in said channel, the first and second terminals of the plurality of transistors of the first type being coupled together in series between the control gate terminal and ground, the gate and the first terminals of each of the plurality of transistors of the first type being selectively coupled together.

59. The memory device of claim 57 wherein each of the fuse elements comprise a split gate memory cell and the clamp is coupled to a control gate of the split gate memory cell.

60. The memory device of claim 57 wherein the clamp is selectively operable during a read cycle.

61. A memory device comprising:
a plurality of memory elements, each memory element comprising:
first and second fuse elements;
a latch coupled to the first and second fuse elements for storing the contents of the first and second fuse elements; and
at least one clamp coupled to a control signal terminal of at least one fuse element.

62. The memory device of claim 61 wherein the clamp comprises a plurality of transistors of the first type including a first terminal, a second terminal spaced apart from said first terminal with a channel therebetween, and a gate for controlling current in said channel, the first and second terminals of the plurality of transistors of the first type being coupled together in series between the control gate terminal and ground, the gate and the first terminals of each of the plurality of transistors of the first type being selectively coupled together.

63. The memory device of claim 61 wherein each of the fuse elements comprise a split gate memory cell and the clamp is coupled to a control gate of the split gate memory cell.

64. The memory device of claim 61 wherein the clamp is selectively operable during a read cycle.

65. A memory device comprising:
first and second fuse elements;
a latch coupled to the first and second fuse elements for storing the contents of the first and second fuse elements; and
a forcing circuit forcing the first and second fuse elements to a particular state.

66. A memory device comprising:
a plurality of memory elements, each memory element comprising first and second fuse elements and a latch coupled to the first and second fuse elements for storing the contents of the first and second fuse elements, and a forcing circuit forcing the first and second fuse elements to a particular state.

67. A memory device comprising:
first and second fuse elements; and
a latch coupled to the first and second fuse elements for storing the contents of the first and second fuse elements, the latch and the first and second fuse elements being arranged as a differential amplifier, each fuse element being biased by a constant current.

68. The memory device of claim 67 wherein the latch cross couples the first and second fuse elements.

69. The memory device of claim 67 wherein the first and second fuse elements are coupled to the latch as an input pair of the differential amplifier.

70. A memory device comprising:
first and second fuse elements;
a latch coupled to the first and second fuse elements for storing the contents of the first and second fuse elements and arranged as a differential amplifier; and
first and second margining circuits coupled in parallel to the first and second fuse elements, respectively.

71. The memory device of claim 70 wherein the first and second margining circuits each comprise first and second transistors of a first type, the first transistor of the first type including a first terminal coupled to a first terminal of the corresponding fuse element, including a second terminal spaced apart from the first terminal with a channel therebetween, and a gate for controlling the flow of current in said channel, the second transistor of the first type including a first terminal coupled to the second terminal of the first transistor of the first type, including a second terminal coupled to a second terminal of the fuse element and spaced apart from the first terminal with a channel therebetween, and a gate for controlling the flow of current in said channel.

72. The memory device of claim 71 wherein the first and second fuse elements each comprise a split gate memory having a control gate and a floating gate.

73. The memory device of claim 70 further comprising an equalization network coupled between the first and second fuse elements to equalize a control voltage applied to the first and second fuse elements.

74. The memory device of claim 70 further comprising a forcing circuit forcing the fuse to a particular state.

75. A memory device comprising:
first and second fuse elements;
a latch coupled to the first and second fuse elements for storing the contents of the first and second fuse elements and arranged as a different amplifier; and
a voltage shift circuit providing a voltage signal selectively having a high voltage value or a low voltage value in response to an input signal having a voltage level that is at a supply voltage or the low voltage and coupled to the first or second fuse elements to apply the voltage signal thereto.

76. The memory device of claim 75 wherein the voltage shift circuit comprises a cross coupled stage and an output stage,
the cross coupled stage comprising first, second, third and fourth PMOS transistors, the first PMOS transistor including a first terminal coupled to a high voltage terminal, including a second terminal coupled to a first bias terminal and spaced apart from said first terminal with a channel therebetween, including a gate for controlling current in said channel, and including a well, the second PMOS transistor including a first terminal coupled to the second terminal of the first PMOS transistor, including a second terminal spaced apart from said first terminal with a channel therebetween, including a gate coupled to the gate of the first PMOS transistor for controlling current in said channel, and including a well coupled to the first bias terminal, the third PMOS transistor including a first terminal coupled to the high voltage terminal, including a second terminal coupled to a second bias terminal and spaced apart from said first terminal with a channel therebetween, including a gate coupled to the second terminal of the second PMOS transistor for controlling current in said channel, and including a well, the fourth PMOS transistor including a first terminal coupled to the second terminal of the third PMOS transistor, including a second terminal coupled to a node formed of the gates of the first and second PMOS transistors, including a gate coupled to the gate of the third PMOS transistor, including a well coupled to the second bias terminal, the output stage comprising fifth, sixth, seventh and eighth PMOS transistors, the fifth PMOS transistor including a first terminal coupled to the high voltage terminal, including a second terminal coupled to a third bias terminal and spaced apart from said first terminal with a channel therebetween, including a gate coupled to the second terminal of the second PMOS transistor for controlling current in said channel, and including a well, the sixth PMOS transistor including a first terminal coupled to the second terminal of the fifth PMOS transistor, including a second terminal coupled to a first output terminal and spaced apart from said first terminal with a channel therebetween, including a gate coupled to the gate of the fifth PMOS transistor for controlling current in said channel, and including a well coupled to the third bias terminal, the seventh PMOS transistor including a first terminal coupled to the high voltage terminal, including a second terminal coupled to a fourth bias terminal and spaced apart from said first terminal with a channel therebetween, including a gate coupled to the second terminal of the fourth PMOS transistor for controlling current in said channel, and including a well, the eighth PMOS transistor including a first terminal coupled to the second terminal of the seventh PMOS transistor, including a second terminal coupled to a second output terminal and spaced apart from said first terminal with a channel therebetween, including a gate coupled to the gate of the seventh PMOS transistor for controlling current in said channel, and including a well coupled to the fourth bias terminal, the wells of the second, fourth, sixth, and eighth PMOS transistors being separate from each other, the wells of the first, third, fifth, and seventh PMOS transistors being coupled to the high voltage terminal.

77. The memory device of claim 76, wherein the cross coupled stage further comprises a first NMOS transistor including a first terminal coupled to a first medium voltage terminal, including a second terminal coupled to the first bias terminal and spaced apart from said first terminal with the channel therebetween, and including a gate coupled to the said first terminal for controlling current in said channel, and further comprises a second NMOS transistor including a first terminal coupled to the first medium voltage terminal, including a second terminal coupled to the second bias terminal and spaced apart from said first terminal with the channel therebetween, and including a gate coupled to said first terminal for controlling current in said channel, and the output stage further comprises a third NMOS transistor including a first terminal coupled to the first medium voltage terminal, including a second terminal coupled to the third bias terminal and spaced apart from said first terminal with a channel therebetween, and including a gate coupled to said first terminal for controlling current in said channel, and further comprises a fourth NMOS transistor inclining a first terminal coupled to the first medium voltage terminal, including a second terminal coupled to the fourth bias terminal and spaced apart from said first terminal with a channel therebetween, and including a gate coupled to the said first terminal for controlling current in said channel.

78. The memory device of claim 77 wherein the cross coupled stage further comprises fifth, sixth, seventh, eighth, ninth, and tenth NMOS transistors, the fifth NMOS transistor including a first terminal coupled to the second terminal of the second PMOS transistor, including a second terminal coupled to a fifth bias terminal and spaced apart from said first terminal with a channel therebetween, and including a gate coupled to a second medium bias voltage terminal for controlling current in said channel, the sixth NMOS transistor including a first terminal coupled to the second terminal of the fifth NMOS transistor, including a second terminal coupled to a ground terminal and spaced apart from said first terminal with a channel therebetween, and including a gate coupled to a first control signal for controlling current in said channel, the seventh NMOS transistor including a first terminal coupled to the first medium voltage terminal, including a second terminal coupled to the fifth bias terminal and spaced apart from said first terminal with a channel therebetween, and including a gate coupled to a second control signal for controlling current in said channel, the second control signal being complementary of the first control signal, the eighth NMOS transistor including a first terminal coupled to the second terminal of the fourth PMOS transistor, including a second terminal coupled to a sixth bias terminal and spaced apart from said first terminal with a channel therebetween, and including a gate coupled to the second medium bias voltage terminal for controlling current in said channel, the ninth NMOS transistor including a first terminal coupled to the second terminal of the eighth NMOS transistor, including a second terminal coupled to the ground terminal and spaced apart from said first terminal with a channel therebetween, and including a gate coupled to the second control signal for controlling current in said channel, the tenth NMOS transistor including a first terminal coupled to the first medium voltage terminal, including a second terminal coupled to the sixth bias voltage terminal and spaced apart from said first terminal with a channel therebetween, and including a gate coupled to the first control signal for controlling current in said channel, the output stage further comprising eleventh, twelfth, thirteenth, and fourteenth NMOS transistors, the eleventh NMOS transistor including a first terminal coupled to the first output terminal, including a second terminal spaced apart from said first terminal with a channel therebetween, and including a gate coupled to the second medium bias voltage terminal for controlling current in said channel, the twelfth NMOS transistor including a first terminal coupled to the second terminal of the eleventh NMOS transistor, including a second terminal coupled to the ground terminal and spaced apart from said first terminal with a channel therebetween, and including a gate coupled to the second control signal for controlling current in said channel, the thirteenth NMOS transistor including a first terminal coupled to the second output terminal, including a second terminal spaced apart from said first terminal with a channel therebetween, and including a gate coupled to the second medium bias voltage terminal for controlling current in said channel, the fourteenth NMOS transistor including a first terminal coupled to the second terminal of the thirteenth NMOS transistor, including a second terminal coupled to the ground terminal and spaced apart from said first terminal with a channel therebetween, and including a gate coupled to the first control signal for controlling current in said channel.

79. The memory device of claim 78 wherein the first and second control signals are non-overlapping.

80. A memory device comprising:

first and second fuse elements;

a latch coupled to the first and second fuse elements for storing the contents of the first and second fuse elements and arranged as a different amplifier; and a bootstrap high voltage transceiver coupled to the first and second fuse elements to provide a voltage signal selectively having a high voltage value or a low voltage value in response to an input signal having a voltage that is at a supply voltage or the low voltage.

81. A memory device comprising:

first and second fuse elements;

a latch coupled to the first and second fuse elements for storing the contents of the first and second fuse elements and arranged as a different amplifier; and a limited current high voltage transceiver coupled to the first and second fuse elements to provide a voltage signal selectively having a high voltage value or a low voltage value in response to an input signal having a voltage that is at a supply voltage or the low voltage.

82. A memory device comprising:

first and second fuse elements; and a latch coupled to the first and second fuse elements for storing the contents of the first and second fuse elements and arranged as a different amplifier, wherein the fuse elements have a control gate and the control gate of one of the first and second fuse elements is set to a reference voltage and a reference value of the control gate of the other of the first and second fuse elements is compared by the corresponding latch of the fuse element.

83. A memory device comprising:

first and second fuse elements; and a latch coupled to the first and second fuse elements for storing the contents of the first and second fuse elements and arranged as a different amplifier, wherein the fuse elements have a bit line terminal and the bit line terminal of one of the first and second fuse elements is coupled to a current offset signal and a reference value of the bit line terminal of the other of the first and second fuse elements is compared by the corresponding latch of the fuse element.

84. A memory device comprising:

first and second fuse elements;

a latch coupled to the first and second fuse elements for storing the contents of the first and second fuse elements and arranged as a different amplifier; and a filter coupled to each fuse element.

85. The memory device of claim 84 wherein the filter is a resistor-capacitor network filter.

86. A memory device comprising:

first and second fuse elements;

a latch coupled to the first and second fuse elements for storing the contents of the first and second fuse elements and arranged as a different amplifier; and an equalization network coupled between the first and second fuse elements to equalize a control voltage applied to the first and second fuse elements.

87. A memory device comprising:

first and second fuse elements;

a latch coupled to the first and second fuse elements for storing the contents of the first and second fuse elements and arranged as a different amplifier; and at least one clamp coupled to a control signal terminal of at least one fuse element.

88. The memory device of claim 87 wherein the clamp is selectively operable during a read cycle.

89. A memory device comprising:

a plurality of memory elements, each memory element comprising first and second fuse elements and a latch coupled to the first and second fuse elements for storing the contents of the first and second fuse elements and includes a differential amplifier, the first and second fuse elements being arranged as an input pair of the differential amplifier, each fuse element having a gate terminal to receive a corresponding voltage bias input signal.

90. A memory device comprising:

a plurality of memory elements, each memory element comprising:

first and second fuse elements, the first and second fuse elements being readable with constant current and programmable with constant current;

a latch coupled to the first and second fuse elements for storing the contents of the first and second fuse elements.

91. A voltage shift circuit comprising:

a cross coupled stage comprising first, second, third and fourth PMOS transistors, the first PMOS transistor including a first terminal coupled to a high voltage terminal, including a second terminal coupled to a first bias terminal and spaced apart from said first terminal with a channel therebetween, including a gate for controlling current in said channel, and including a well, the second PMOS transistor including a first terminal coupled to the second terminal of the first PMOS transistor, including a second terminal spaced apart from said first terminal with a channel therebetween, including a gate coupled to the gate of the first PMOS transistor for controlling current in said channel, and including a well coupled to the first bias terminal, the third PMOS transistor including a first terminal coupled to the high voltage terminal, including a second terminal coupled to a second bias terminal and spaced apart from said first terminal with a channel therebetween, including a gate coupled to the second terminal of the second PMOS transistor for controlling current in said channel, and including a well, the fourth PMOS transistor including a first terminal coupled to the second terminal of the third PMOS transistor, including a second terminal coupled to a node formed of the gates of the first and second PMOS transistors, including a gate coupled to the gate of the third PMOS transistor, including a well coupled to the second bias terminal; and an output stage comprising fifth, sixth, seventh and eighth PMOS transistors, the fifth PMOS transistor including a first terminal coupled to the high voltage terminal, including a second terminal coupled to a third bias terminal and spaced apart from said first terminal with a channel therebetween, including a gate coupled to the second terminal of the second PMOS transistor for controlling current in said channel, and including a well, the sixth PMOS transistor including a first terminal coupled to the second terminal of the fifth PMOS transistor, including a second terminal coupled to a first output terminal and spaced apart from said first terminal with a channel therebetween, including a gate coupled to the gate of the fifth PMOS transistor for controlling current in said channel, and including a well coupled to the third bias terminal, the seventh PMOS transistor including a first terminal coupled to the high voltage terminal, including a second terminal coupled to a fourth bias terminal and spaced apart from said first terminal with a channel therebetween, including a gate coupled to the second terminal of the fourth PMOS transistor for controlling current in said channel, and including a well, the eighth PMOS transistor including a first terminal coupled to the second terminal of the seventh PMOS transistor, including a second terminal coupled to a second output terminal and spaced apart from said first terminal with a channel therebetween, including a gate coupled to the gate of the seventh PMOS transistor for controlling current in said channel, and including a well coupled to the fourth bias terminal, the wells of the second, fourth, sixth, and eighth PMOS transistors being separate from each other, the wells of the first, third, fifth, and seventh PMOS transistors being coupled to the high voltage terminal.

92. The voltage shift circuit of claim 91, wherein the cross coupled stage further comprises a first NMOS transistor including a first terminal coupled to a first medium voltage terminal, including a second terminal coupled to the first bias terminal and spaced apart from said first terminal with the channel therebetween, and including a gate coupled to the said first terminal for controlling current in said channel, and further comprises a second NMOS transistor including a first terminal coupled to the first medium voltage terminal, including a second terminal coupled to the second bias terminal and spaced apart from said first terminal with the channel therebetween, and including a gate coupled to said first terminal for controlling current in said channel, and the output stage further comprises a third NMOS transistor including a first terminal coupled to the first medium voltage terminal, including a second terminal coupled to the third bias terminal and spaced apart from said first terminal with a channel therebetween, and including a gate coupled to said first terminal for controlling current in said channel, and further comprises a fourth NMOS transistor inclining a first terminal coupled to the first medium voltage terminal, including a second terminal coupled to the fourth bias terminal and spaced apart from said first terminal with a channel therebetween, and including a gate coupled to the said first terminal for controlling current in said channel.

93. The voltage shift circuit of claim 92 wherein the cross coupled stage further comprises fifth, sixth, seventh, eighth, ninth, and tenth NMOS transistors, the fifth NMOS transistor including a first terminal coupled to the second terminal of the second PMOS transistor, including a second terminal coupled to a fifth bias terminal and spaced apart from said first terminal with a channel therebetween, and including a gate coupled to a second medium bias voltage terminal for controlling current in said channel, the sixth NMOS transistor including a first terminal coupled to the second terminal of the fifth NMOS transistor, including a second terminal coupled to a ground terminal and spaced apart from said first terminal with a channel therebetween, and including a gate coupled to a first control signal for controlling current in said channel, the seventh NMOS transistor including a first terminal coupled to the first medium voltage terminal, including a second terminal coupled to the fifth bias terminal and spaced apart from said first terminal with a channel therebetween, and including a gate coupled to a second control signal for controlling current in said channel, the second control signal being complementary of the first control signal, the eighth NMOS transistor including a first terminal coupled to the second terminal of the fourth PMOS transistor, including a second terminal coupled to a sixth bias terminal and spaced apart from said first terminal with a channel therebetween, and including a gate coupled to the second medium bias voltage terminal for controlling current in said channel, the ninth NMOS transistor including a first terminal coupled to the second terminal of the eighth NMOS transistor, including a second terminal coupled to the ground terminal and spaced apart from said first terminal with a channel therebetween, and including a gate coupled to the second control signal for controlling current in said channel, the tenth NMOS transistor including a first terminal coupled to the first medium voltage terminal, including a second terminal coupled to the sixth bias voltage terminal and spaced apart from said first terminal with a channel therebetween, and including a gate coupled to the first control signal for controlling current in said channel, the output stage further comprising eleventh, twelfth, thirteenth, and fourteenth NMOS transistors, the eleventh NMOS transistor including a first terminal coupled to the first output terminal, including a second terminal spaced apart from said first terminal with a channel therebetween, and including a gate coupled to the second medium bias voltage terminal for controlling current in said channel, the twelfth NMOS transistor including a first terminal coupled to the second terminal of the eleventh NMOS transistor, including a second terminal coupled to the ground terminal and spaced apart from said first terminal with a channel therebetween, and including a gate coupled to the second control signal for controlling current in said channel, the thirteenth NMOS transistor including a first terminal coupled to the second output terminal, including a second terminal spaced apart from said first terminal with a channel therebetween, and including a gate coupled to the second medium bias voltage terminal for controlling current in said channel, the fourteenth NMOS transistor including a first terminal coupled to the second terminal of the thirteenth NMOS transistor, including a second terminal coupled to the ground terminal and spaced apart from said first terminal with a channel therebetween, and including a gate coupled to the first control signal for controlling current in said channel.

94. The voltage shift circuit of claim 93 wherein the first and second control signals are non-overlapping.

95. The voltage shift circuit of claim 93 wherein a signal applied to the memory cells is set at a voltage to stress the memory cells.

* * * * *